United States Patent
Lin et al.

(10) Patent No.: US 10,276,616 B2
(45) Date of Patent: Apr. 30, 2019

(54) IMAGE SENSOR DEVICE

(71) Applicant: Taiwan Semiconductor Manufacturing Co., Ltd., Hsinchu (TW)

(72) Inventors: Kun-Huei Lin, Tainan (TW);
Yin-Chieh Huang, Tainan (TW);
Yun-Wei Cheng, Taipei (TW);
Yi-Hsing Chu, Tainan (TW);
Cheng-Yuan Li, Kaohsiung (TW);
Chun-Hao Chou, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 15 days.

(21) Appl. No.: 15/692,395

(22) Filed: Aug. 31, 2017

(65) Prior Publication Data

US 2019/0067356 A1 Feb. 28, 2019

(51) Int. Cl.
*H01L 27/14* (2006.01)
*H01L 27/146* (2006.01)

(52) U.S. Cl.
CPC .... *H01L 27/14629* (2013.01); *H01L 27/1463* (2013.01); *H01L 27/14621* (2013.01); *H01L 27/14645* (2013.01); *H01L 27/14685* (2013.01); *H01L 27/1464* (2013.01); *H01L 27/14627* (2013.01); *H01L 27/14636* (2013.01)

(58) Field of Classification Search
CPC ......... H01L 27/14629; H01L 27/14621; H01L 27/1463; H01L 27/14645; H01L 27/14685; H01L 27/14667
See application file for complete search history.

(56) References Cited

U.S. PATENT DOCUMENTS

| | | | |
|---|---|---|---|
| 8,405,182 B2 * | 3/2013 | Chou | H01L 27/14623 257/435 |
| 9,130,072 B1 * | 9/2015 | Chen | H01L 27/1464 |
| 9,130,077 B2 * | 9/2015 | Weng | H01L 31/0232 |
| 9,324,752 B2 * | 4/2016 | Chien | H01L 27/14623 |
| 9,431,452 B1 * | 8/2016 | Liu | H01L 27/14645 |
| 9,443,899 B1 * | 9/2016 | Liu | H01L 27/14643 |
| 9,564,468 B2 * | 2/2017 | Chou | H01L 27/14645 |
| 9,627,426 B2 * | 4/2017 | Chien | H01L 27/14629 |
| 9,666,624 B2 * | 5/2017 | Lin | H01L 27/14643 |
| 9,741,760 B2 * | 8/2017 | Shinohara | H01L 27/1464 |

(Continued)

*Primary Examiner* — Ida M Soward
(74) *Attorney, Agent, or Firm* — Birch, Stewart, Kolasch & Birch, LLP

(57) ABSTRACT

An image sensor device is provided. The image sensor device includes a semiconductor substrate having a first light-sensing region and a second light-sensing region adjacent to the first light-sensing region. The image sensor device includes an isolation structure in the semiconductor substrate and surrounding the first light-sensing region and the second light-sensing region. The image sensor device includes a reflective grid over the isolation structure and surrounding the first light-sensing region and the second light-sensing region. The image sensor device includes a first color filter over the first light-sensing region and extending into a first trench of the reflective grid. The image sensor device includes a second color filter over the second light-sensing region and extending into the first trench to be in direct contact with the first color filter in the first trench.

20 Claims, 23 Drawing Sheets

(56) References Cited

U.S. PATENT DOCUMENTS

| | | | |
|---|---|---|---|
| 9,748,298 B2* | 8/2017 | Lenchenkov | H01L 27/1463 |
| 9,786,710 B2* | 10/2017 | Chang | H01L 27/14645 |
| 9,799,697 B2* | 10/2017 | Lee | H01L 27/14645 |
| 9,806,116 B2* | 10/2017 | Tsai | H01L 27/1462 |
| 9,842,870 B2* | 12/2017 | Chung | H01L 27/14609 |
| 2008/0283727 A1* | 11/2008 | Kitano | H01L 27/1462 |
| | | | 250/208.1 |
| 2013/0134536 A1* | 5/2013 | Mori | H01L 27/1462 |
| | | | 257/432 |
| 2016/0204143 A1* | 7/2016 | Lee | H01L 27/1463 |
| | | | 257/229 |
| 2016/0204144 A1* | 7/2016 | Lee | H01L 27/1463 |
| | | | 257/229 |
| 2017/0186805 A1* | 6/2017 | Lee | H01L 27/14645 |
| 2018/0033820 A1* | 2/2018 | Chen | H01L 27/14698 |
| 2018/0053797 A1* | 2/2018 | Lee | H01L 27/14621 |
| 2018/0211986 A1* | 7/2018 | Lee | H01L 27/1463 |

* cited by examiner

IMAGE SENSOR DEVICE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices (e.g., image sensor devices) at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1G-1 is a top view of the image sensor device of FIG. 1G, in accordance with some embodiments.

FIG. 1G-2 is a cross-sectional view illustrating the image sensor device along a sectional line II-II' in FIG. 1G-1, in accordance with some embodiments.

FIG. 1G-3 is a cross-sectional view illustrating the image sensor device along a sectional line III-III' in FIG. 1G-1, in accordance with some embodiments.

FIG. 1H-1 is a top view of the image sensor device of FIG. 1H, in accordance with some embodiments.

FIG. 1H-2 is a cross-sectional view illustrating the image sensor device along a sectional line II-II' in FIG. 1H-1, in accordance with some embodiments.

FIG. 1H-3 is a cross-sectional view illustrating the image sensor device along a sectional line III-III' in FIG. 1H-1, in accordance with some embodiments.

FIG. 1I-1 is a top view of the image sensor device of FIG. 1I, in accordance with some embodiments.

FIG. 1I-2 is a cross-sectional view illustrating the image sensor device along a sectional line II-II' in FIG. 1I-1, in accordance with some embodiments.

FIG. 1I-3 is a cross-sectional view illustrating the image sensor device along a sectional line III-III' in FIG. 1I-1, in accordance with some embodiments.

FIG. 5A-1 is a cross-sectional view illustrating the image sensor device along a sectional line I-I' in FIG. 5A, in accordance with some embodiments.

FIG. 5A-2 is a cross-sectional view illustrating the image sensor device along a sectional line II-II' in FIG. 5A, in accordance with some embodiments.

DETAILED DESCRIPTION

Figure 1A:
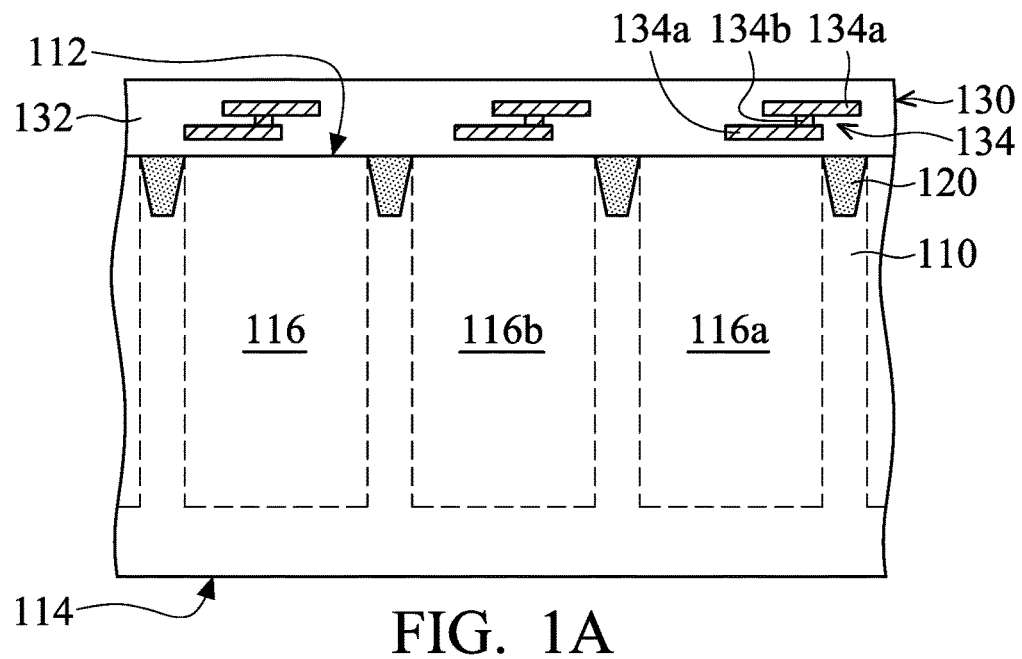
FIGS. 1A-1I are cross-sectional views of various stages of a process for forming an image sensor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1I are cross-sectional views of various stages of a process for forming an image sensor device 100, in accordance with some embodiments. As shown in FIG. 1A, a semiconductor substrate 110 is provided. The semiconductor substrate 110 has a front surface 112 and a back surface 114 opposite to the front surface 112.

The semiconductor substrate 110 may be a silicon substrate doped with a P-type dopant such as boron, in which case the semiconductor substrate 110 is a P-type substrate. Alternatively, the semiconductor substrate 110 could be another suitable semiconductor material. For example, the semiconductor substrate 110 may be a silicon substrate doped with an N-type dopant such as phosphorous or arsenic, in which case the substrate is an N-type substrate. The semiconductor substrate 110 may include other elementary semiconductor materials such as germanium.

In some embodiments, isolation structures 120 are formed in the semiconductor substrate 110 to define various light-sensing regions in the semiconductor substrate 110, and to electrically isolate neighboring devices (e.g. transistors) from one another. In some embodiments, the isolation features 120 are formed adjacent to or near the front surface 112.

In some embodiments, the isolation structures 120 are made of a dielectric material, such as silicon oxide, silicon nitride, silicon oxynitride, fluoride-doped silicate glass (FSG), a low-K dielectric material, other suitable materials, or combinations thereof. In some embodiments, the isolation structures 120 are formed by using an isolation technology, such as local oxidation of semiconductor (LOCOS), shallow trench isolation (STI), or the like.

In some embodiments, the formation of the isolation structures 120 includes patterning the semiconductor substrate 110 by a photolithography process and an etching process (e.g., a dry etching process, a wet etching process, a plasma etching process, or a combination thereof) to form trenches in the semiconductor substrate 110, and filling the trenches (for example, by using a chemical vapor deposition process) with the dielectric material. In some embodiments, the filled trenches have a multilayer structure, such as a thermal oxide liner layer and a silicon nitride layer (or a silicon oxide layer).

In some embodiments, the semiconductor substrate 110 is fabricated with front end processes, in accordance with some embodiments. For example, the semiconductor substrate 110 includes various regions, which may include a pixel region, a periphery region, a bonding pad region, and a scribe line region. For the sake of simplicity, only a portion of the pixel region is shown in FIGS. 1A-1I.

The pixel region includes pixels each with a light-sensing region 116, 116a, 116b, 116c, or 116d (also referred to as a radiation-sensing region). For the sake of simplicity, the light-sensing regions 116c and 116d are shown in FIG. 1G-1, not shown in FIG. 1A, in accordance with some embodiments. The light-sensing regions 116 and 116a-116d of the pixels are doped with a doping polarity that is opposite to that of the semiconductor substrate 110. The light-sensing regions 116 and 116a-116d are formed by one or more implantation processes or diffusion processes.

The light-sensing regions 116 and 116a-116d are formed close to (or adjacent to, or near) the front surface 112 of the semiconductor substrate 110. The light-sensing regions 116 and 116a-116d are operable to sense incident light (or incident radiation) that enters the pixel region. The incident light may be visible light. Alternatively, the incident light may be infrared (IR), ultraviolet (UV), X-ray, microwave, another suitable types of light, or a combination thereof.

Although only a portion of the pixel region is shown in FIGS. 1A-1I, the pixel region may further include pinned layers, photodiode gates, reset transistors, source follower transistors, and transfer transistors. The transfer transistors are electrically connected with the light-sensing regions 116 and 116a-116d to collect (or pick up) electrons generated by incident light (incident radiation) traveling into the light-sensing regions 116 and 116a-116d and to convert the electrons into voltage signals, in accordance with some embodiments. For the sake of simplicity, detailed structures of the above features are not shown in figures of the present disclosure.

In some embodiments, an interconnection structure 130 is formed over the front surface 112. The interconnection structure 130 includes a number of patterned dielectric layers and conductive layers that couple to various doped features, circuitry, photodiode gates, reset transistors, source follower transistors, and transfer transistors. For example, the interconnection structure 130 includes an interlayer dielectric (ILD) layer 132 and a multilayer interconnection (MLI) structure 134 in the ILD layer 132.

The MLI structure 134 includes conductive lines 134a and vias (or contacts) 134b connected between the conductive lines 134a. It should be understood that the conductive lines 134a and the vias 134b are merely exemplary. The actual positioning and configuration of the conductive lines 134a and the vias 134b may vary depending on design needs and manufacturing concerns.

Figure 1B:
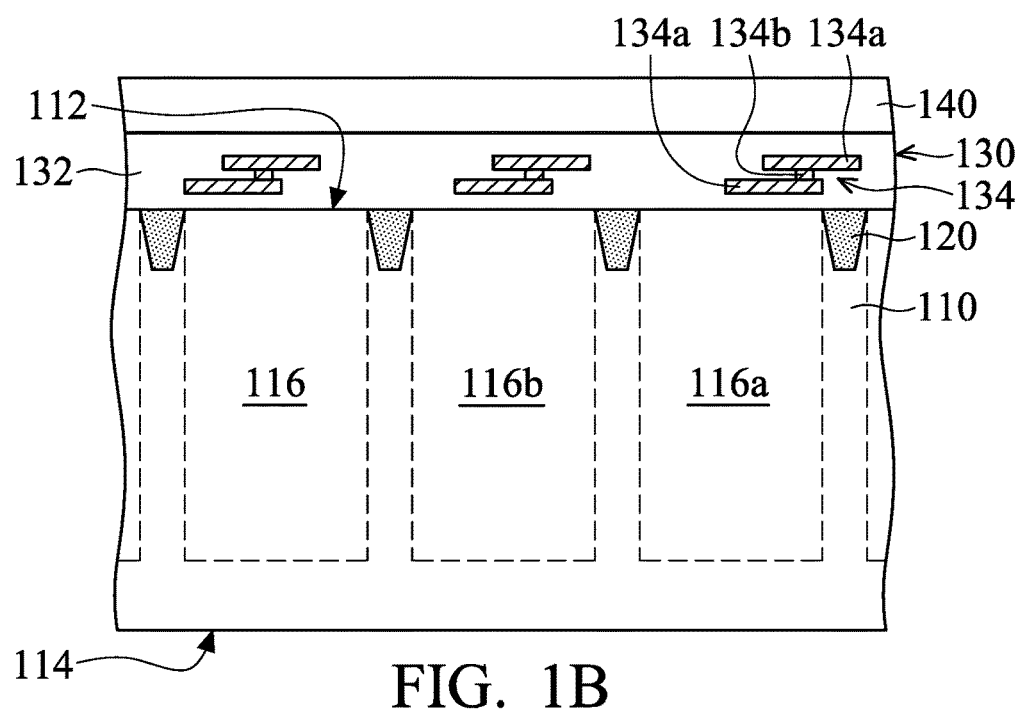
Figure 1C:
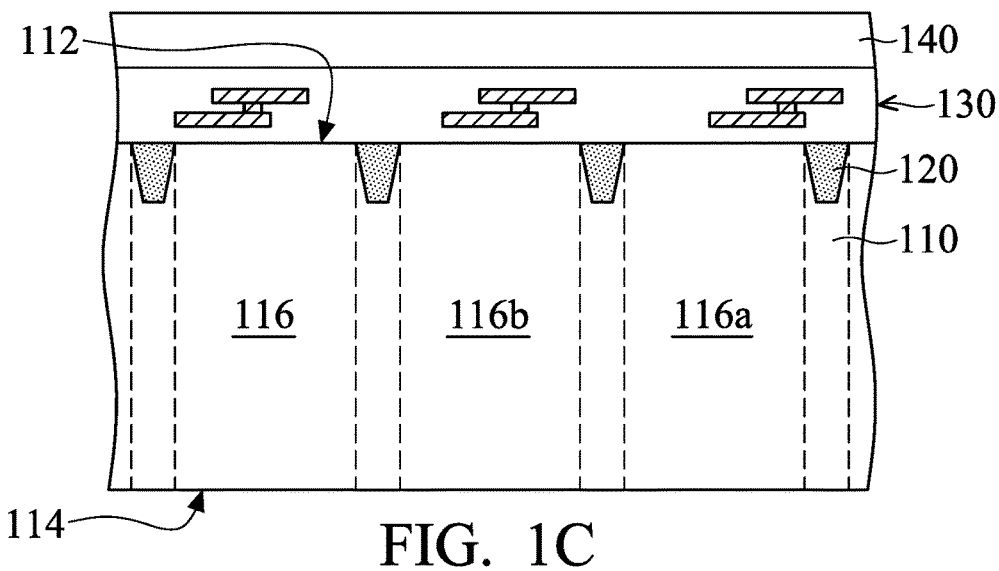

Afterwards, as shown in FIG. 1B, a carrier substrate 140 is bonded with the interconnection structure 130, in accordance with some embodiments. The carrier substrate 140 includes a silicon substrate, a glass substrate or another suitable substrate. Thereafter, as shown in FIGS. 1B and 1C, a thinning process is performed to thin the semiconductor substrate 110 from the back surface 114. The thinning process may include a chemical mechanical polishing process.

Figure 1D:
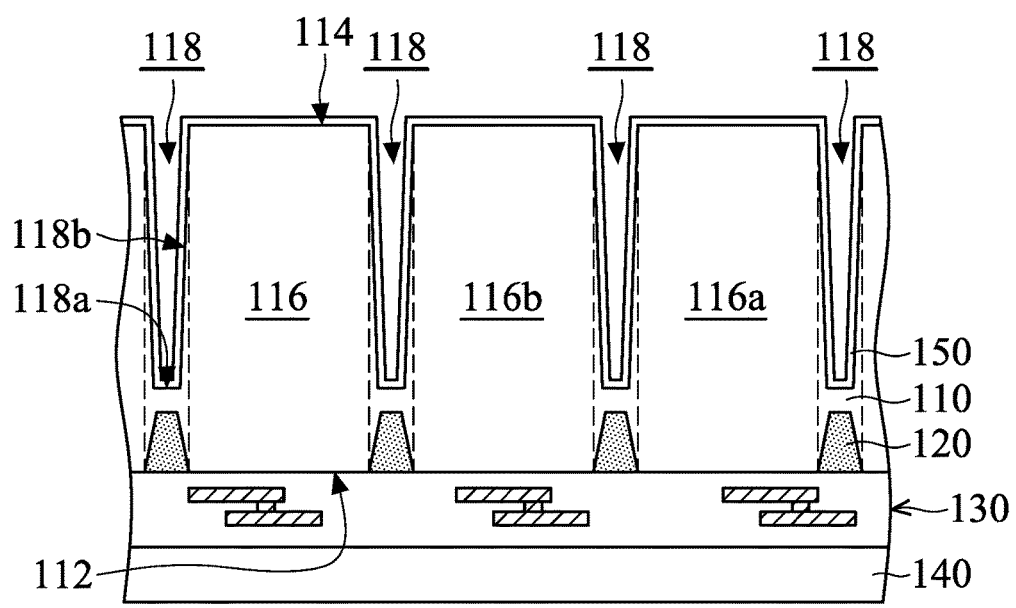
Figure 1E:
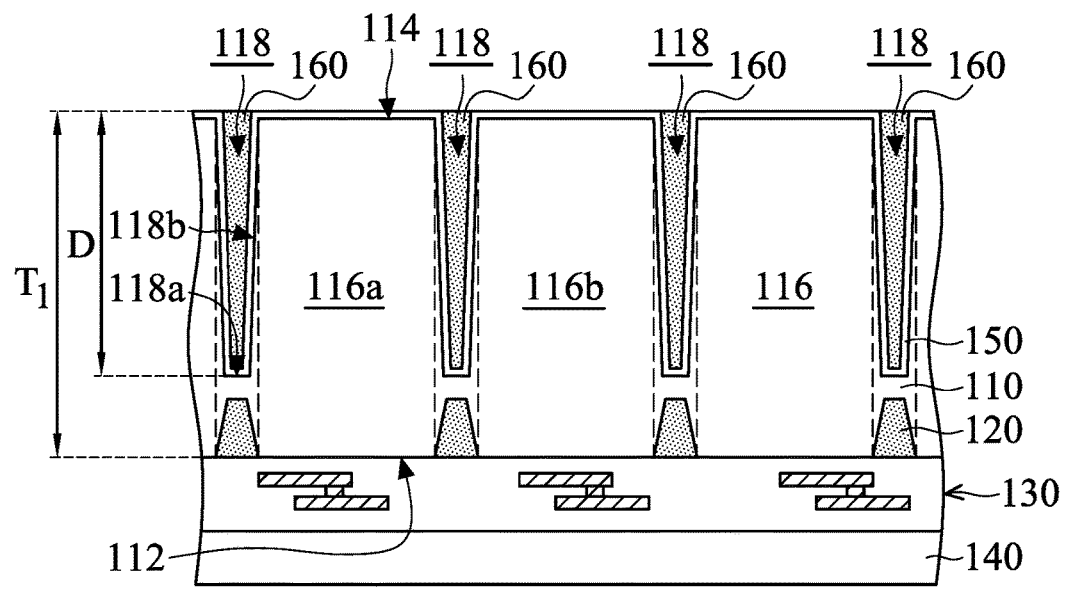

Afterwards, as shown in FIG. 1D, the semiconductor substrate 110 is flipped over, and a trench 118 is formed in the semiconductor substrate 110, in accordance with some embodiments. The trench 118 is also referred to as a deep trench, in accordance with some embodiments. The trench 118 extends from the back surface 114, in accordance with some embodiments.

The trench 118 is between the light-sensing regions 116 and 116a-116d, in accordance with some embodiments. In some embodiments, the trench 118 is above the isolation structures 120. In some embodiments, a ratio of a depth D of the trench 118 to a thickness T1 of the semiconductor substrate 110 ranges from about 50% to about 80%.

Afterwards, an insulating layer 150 is formed on the back surface 114 of the semiconductor substrate 110, bottom surfaces 118a and inner walls 118b of the trench 118, in accordance with some embodiments. In some embodiments, the insulating layer 150 is also referred to as a liner layer or a high K layer.

In some embodiments, the insulating layer 150 is configured to passivate the back surface 114 of the semiconductor substrate 110, the bottom surfaces 118a and the inner walls 118b of the trench 118. In some embodiments, the insulating layer 150 is further configured to electrically isolate the light-sensing regions 116 and 116a-116d from one another to reduce electrical crosstalk between the light-sensing regions 116 and 116a-116d.

The insulating layer 150 is made of a high-k material, a dielectric material, another applicable material, or a combination thereof. The high-k material includes, for example, hafnium oxide, tantalum pentoxide, zirconium dioxide, aluminum oxide, another suitable material, or a combination thereof. The dielectric material includes, for example, silicon nitride, silicon oxynitride, other suitable materials, or a combination thereof. The insulating layer 150 is formed by, for example, a thermal oxidation process or a deposition process.

Thereafter, an isolation structure 160 is filled in the trench 118, in accordance with some embodiments. The isolation structure 160 surrounds the light-sensing regions 116 and 116a-116d, in accordance with some embodiments. The isolation structure 160 is between adjacent two of the light-sensing regions 116 and 116a-116d to separate the light-sensing regions 116 and 116a-116d from each other. Therefore, the light-sensing regions 116 and 116a-116d are electrically insulated from each other by the isolation structure 160, in accordance with some embodiments.

The isolation structure 160 is configured to fill and level up the trench 118, in accordance with some embodiments. The isolation structure 160 is further configured to reflect incident light to prevent the incident light from traveling between different light-sensing regions 116 and 116a-116d, in accordance with some embodiments.

In some embodiments, the isolation structure 160 has a light reflectivity ranging from about 70% to about 99%. The isolation structure 160 is made of a dielectric material, a metal material, an alloy material, or another suitable reflective material. The dielectric material includes oxides, such as silicon oxides, in accordance with some embodiments. The metal material and the alloy material include W, Al, Cu, Ti, an alloy thereof, or a combination thereof, in accordance with some embodiments.

In some embodiments, the method of forming the isolation structure 160 includes depositing a material layer on the semiconductor substrate 110 and filled in the trench 118; and removing the material layer outside of the trench 118. The method of depositing the material layer includes performing a chemical vapor deposition (CVD) process, a physical vapor deposition process, or another suitable process. The method of removing the material layer outside of the trench 118 includes performing a chemical mechanical polishing (CMP) process or another suitable process.

Figure 1F:
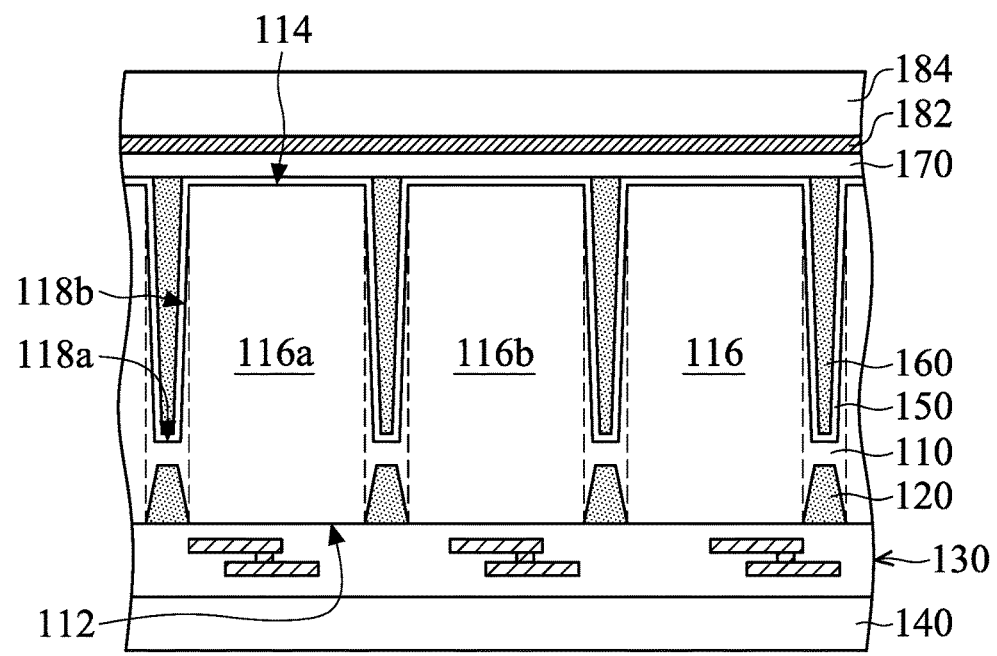
Figure 1G:
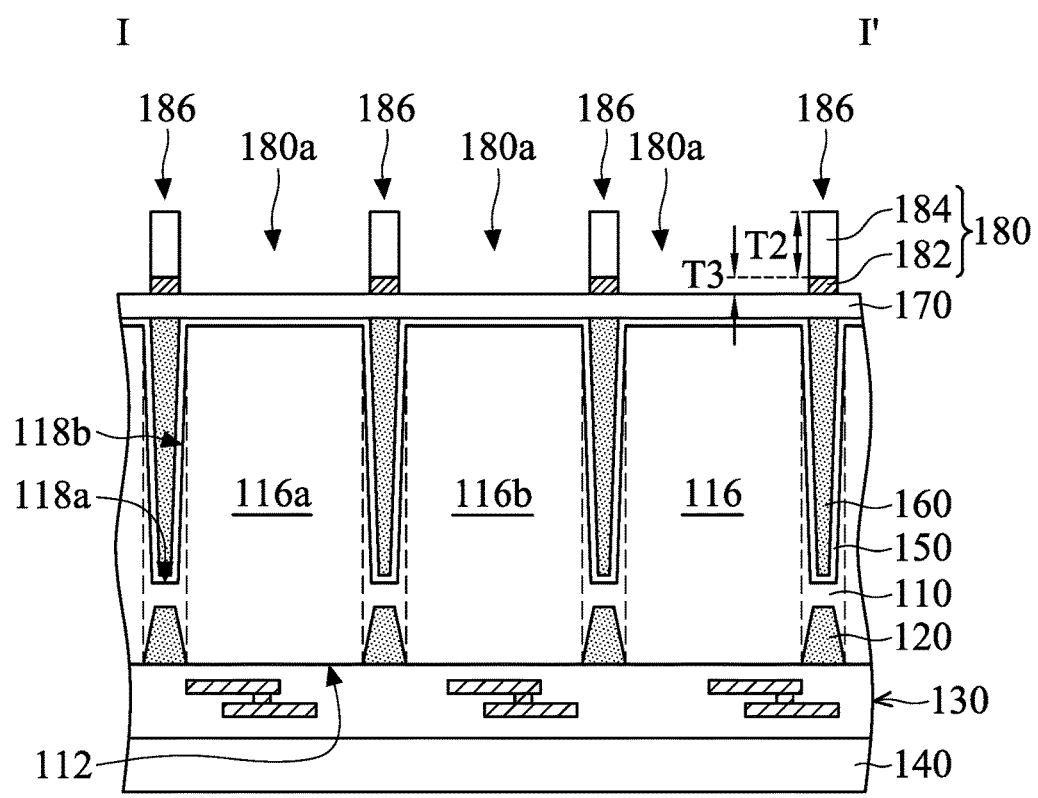
Figures 1, 1G:
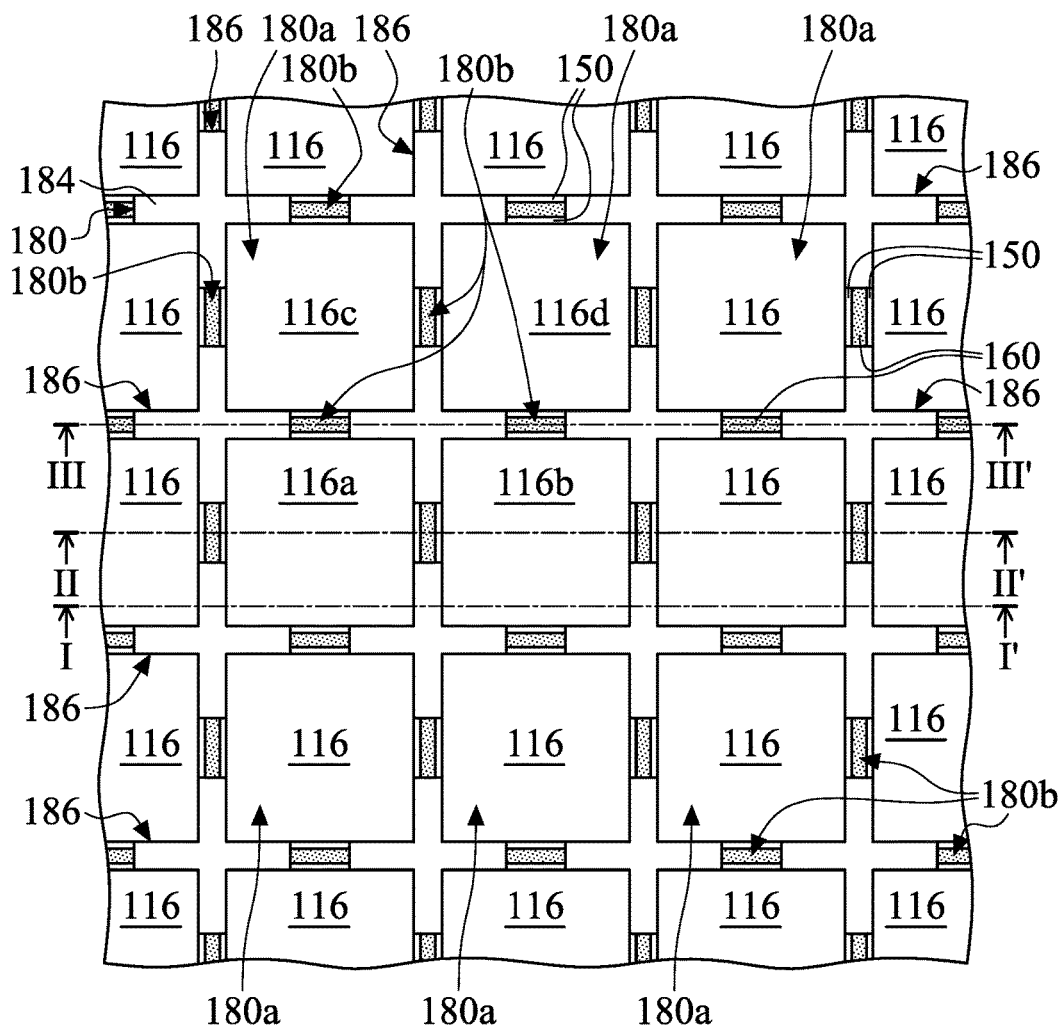

Thereafter, as shown in FIG. 1F, a planarization layer 170 is formed over the back surface 114 of the semiconductor substrate 110, in accordance with some embodiments. The planarization layer 170 is used to provide a planar surface for subsequent processes.

The planarization layer 170 may be made of a dielectric material or another suitable material. For example, the planarization layer 170 is made of silicon oxide, silicon nitride, silicon oxynitride, another applicable material, or a combination thereof.

As shown in FIG. 1F, a metal layer 182 is formed over the planarization layer 170, in accordance with some embodiments. The metal layer 182 is made of aluminum, silver, copper, titanium, platinum, tungsten, tantalum, tantalum nitride, an alloy thereof, a combination thereof, or another suitable reflective material. The metal layer 182 is formed using a physical vapor deposition process, in accordance with some embodiments.

As shown in FIG. 1F, an insulating layer 184 is formed over the metal layer 182, in accordance with some embodiments. The insulating layer 184 is made of oxides, such as silicon oxides, in accordance with some embodiments. The insulating layer 184 is made of silicon nitride, silicon oxynitride, or another suitable material. The insulating layer 184 is formed using a chemical vapor deposition process, in accordance with some embodiments.

FIG. 1G-1 is a top view of the image sensor device of FIG. 1G, in accordance with some embodiments. FIG. 1G is a cross-sectional view illustrating the image sensor device along a sectional line I-I' in FIG. 1G-1, in accordance with some embodiments. For the sake of simplicity, FIG. 1G-1 does not show the planarization layer 170 of FIG. 1G, in accordance with some embodiments.

As shown in FIGS. 1G and 1G-1, portions of the metal layer 182 and the insulating layer 184 are removed, in accordance with some embodiments. After the removal process, the remaining metal layer 182 and the remaining insulating layer 184 together form a reflective grid 180, in accordance with some embodiments. In the reflective grid 180, a thickness T2 of the insulating layer 184 is greater than a thickness T3 of the metal layer 182, in accordance with some embodiments.

The reflective grid 180 has a mesh shape or a mesh-like shape, in accordance with some embodiments. The reflective grid 180 is positioned over the isolation structures 120 and 160, in accordance with some embodiments. The reflective grid 180 surrounds the light-sensing regions 116 and 116a-116d, in accordance with some embodiments. The reflective grid 180 discontinuously surrounds the light-sensing regions 116 and 116a-116d, in accordance with some embodiments.

The reflective grid 180 is between adjacent two of the light-sensing regions 116 and 116a-116d, in accordance with some embodiments. The reflective grid 180 is used to prevent the incident light from entering a neighboring pixel. The crosstalk problems between pixels are thus prevented or reduced.

As shown in FIG. 1G, the reflective grid 180 is arranged aligned with the isolation structures 120 and 160, in accordance with some embodiments. That is, the reflective grid 180 and the isolation structures 120 and 160 are arranged in a straight line perpendicular to the front surface 112 or the back surface 114, in accordance with some embodiments.

The reflective grid 180 has openings 180a respectively over the light-sensing regions 116, 116a, 116b, 116c, and 116d, in accordance with some embodiments. The openings 180a expose the planarization layer 170 over the light-sensing regions 116, 116a, 116b, 116c, and 116d, in accordance with some embodiments.

Figures 1, 1G, 2:
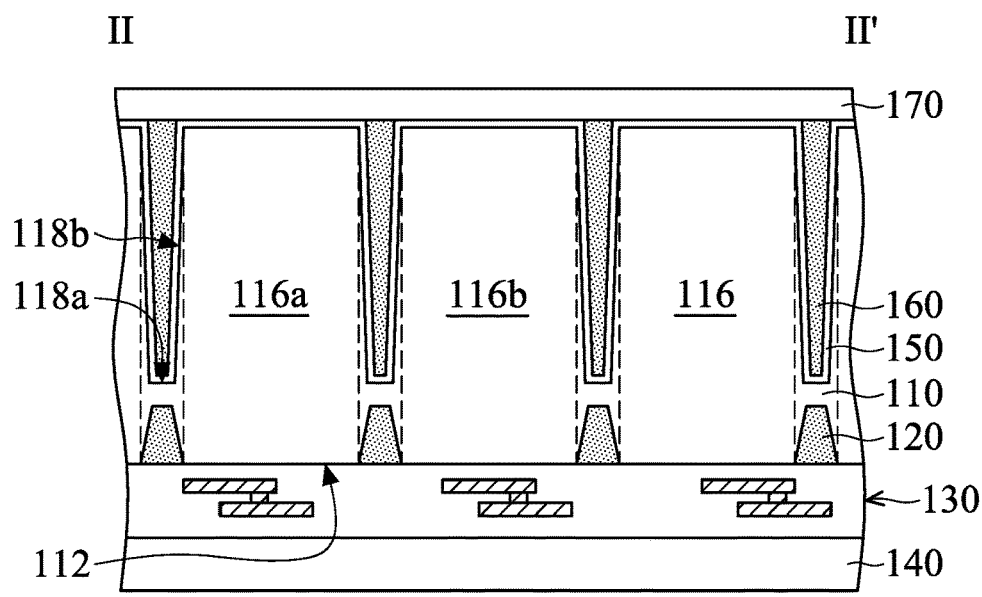
Figures 1, 1G, 2, 3:
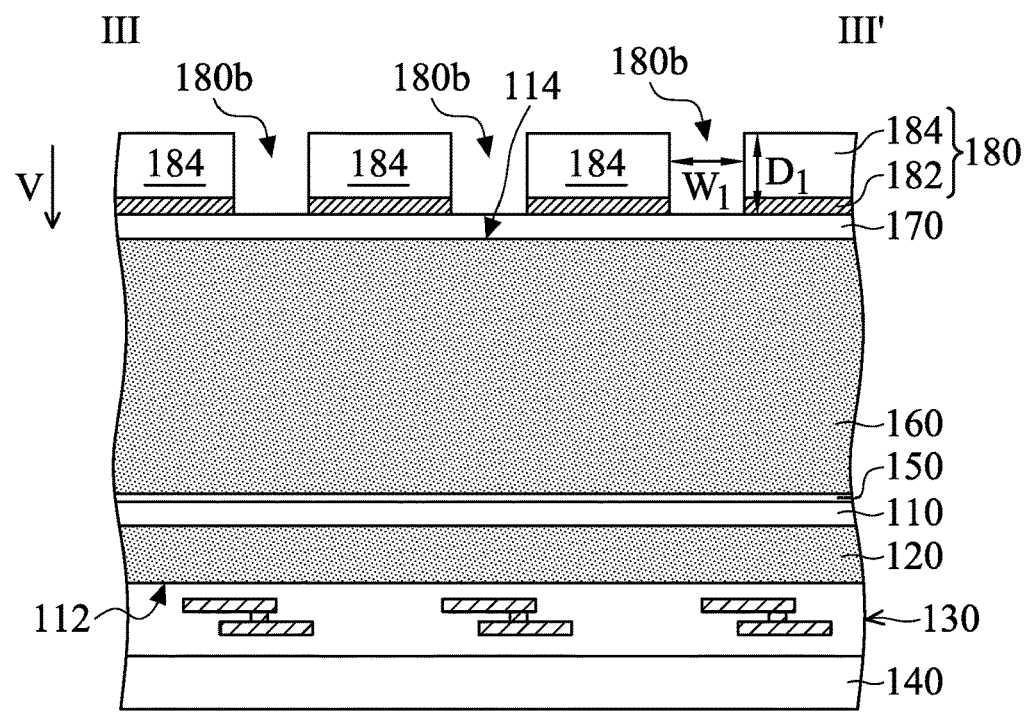

FIG. 1G-2 is a cross-sectional view illustrating the image sensor device along a sectional line II-II' in FIG. 1G-1, in accordance with some embodiments. FIG. 1G-3 is a cross-sectional view illustrating the image sensor device along a sectional line in FIG. 1G-1, in accordance with some embodiments.

As shown in FIGS. 1G-1, 1G-2, and 1G-3, the reflective grid 180 has trenches 180b over the isolation structure 160, in accordance with some embodiments. The trenches 180b pass through the reflective grid 180 in a direction V that is perpendicular to the front surface 112 or the back surface 114, in accordance with some embodiments.

Each of the trenches 180b is positioned between adjacent two of the light-sensing regions 116, 116a, 116b, 116c, and 116d, in accordance with some embodiments. Therefore, two adjacent openings 180a are communicated with each other via the trench 180b therebetween, in accordance with some embodiments.

In some embodiments, all of the openings 180a are communicated with each other via the trenches 180b. The reflective grid 180 has cross-shaped portions 186 spaced apart from each other, in accordance with some embodiments. As shown in FIG. 1G-3, the trenches 180b have the same width W1 and the same depth D1, in accordance with some embodiments.

Figure 1H:
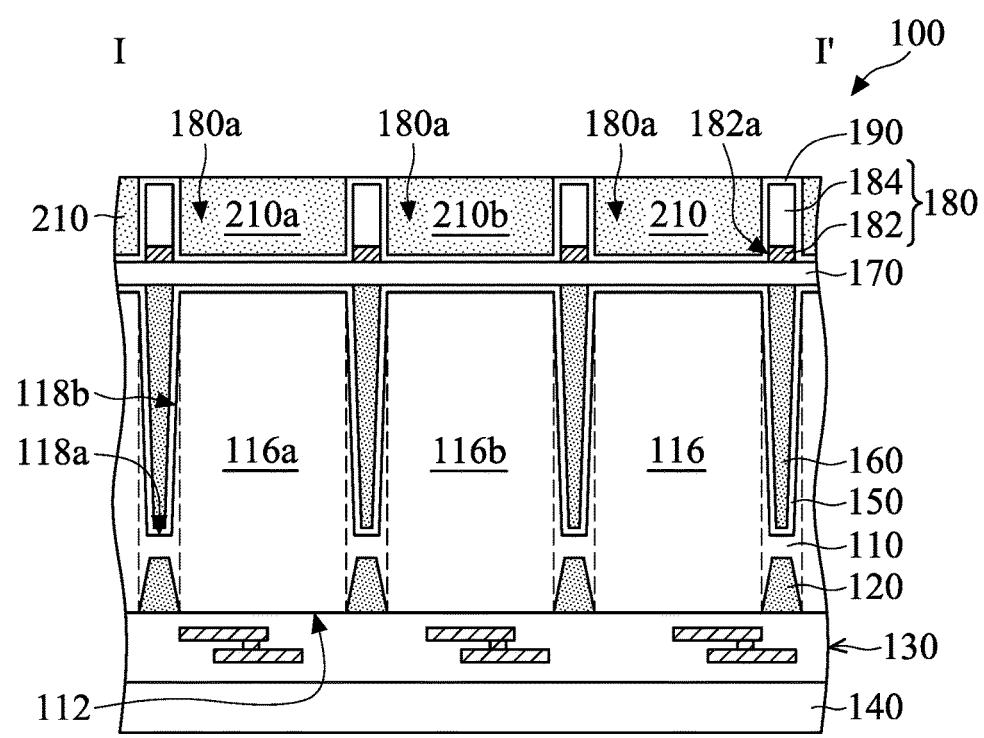
Figures 1, 1H:
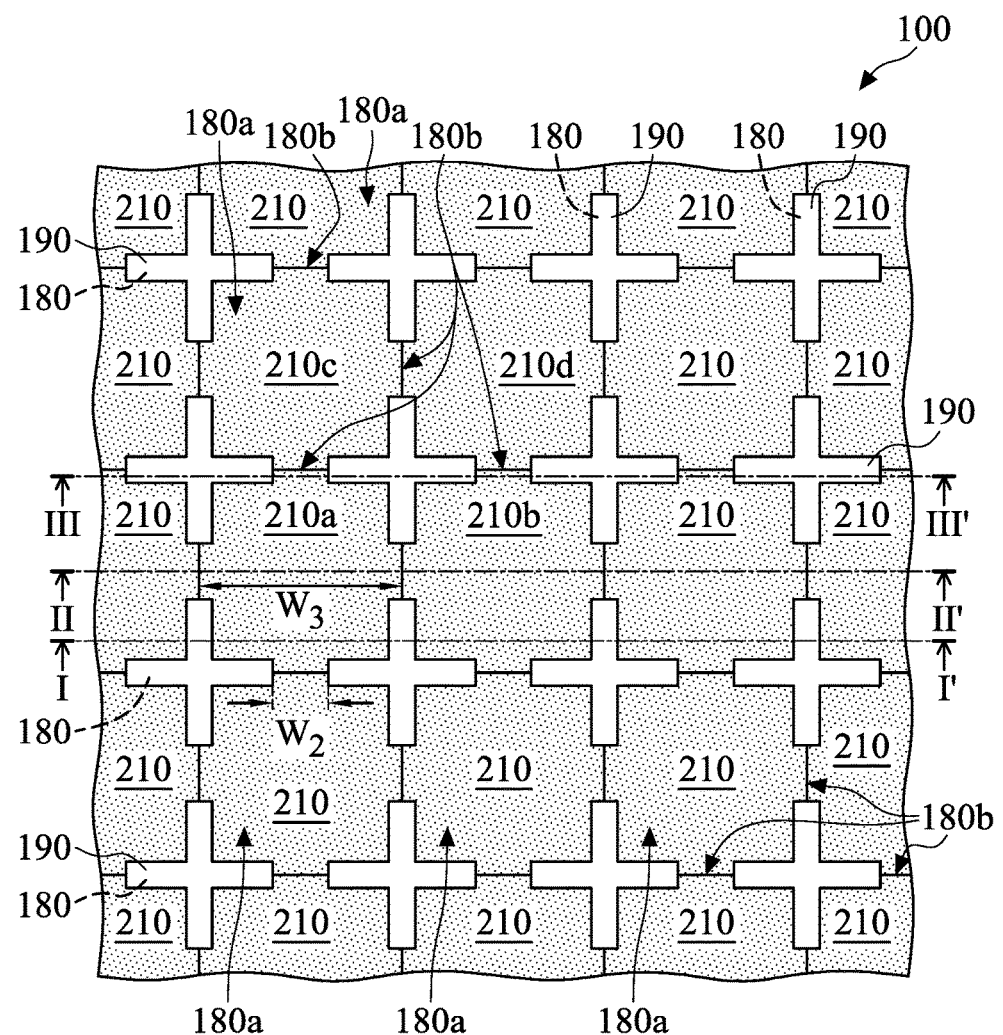
Figures 1, 1H, 2:
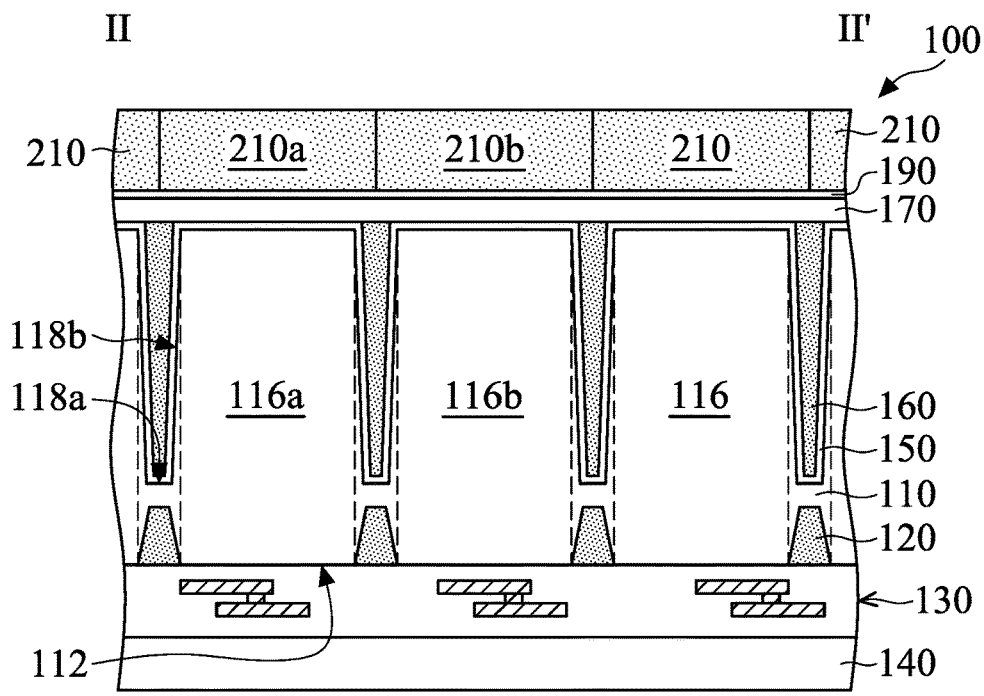
Figures 1, 1H, 2, 3:
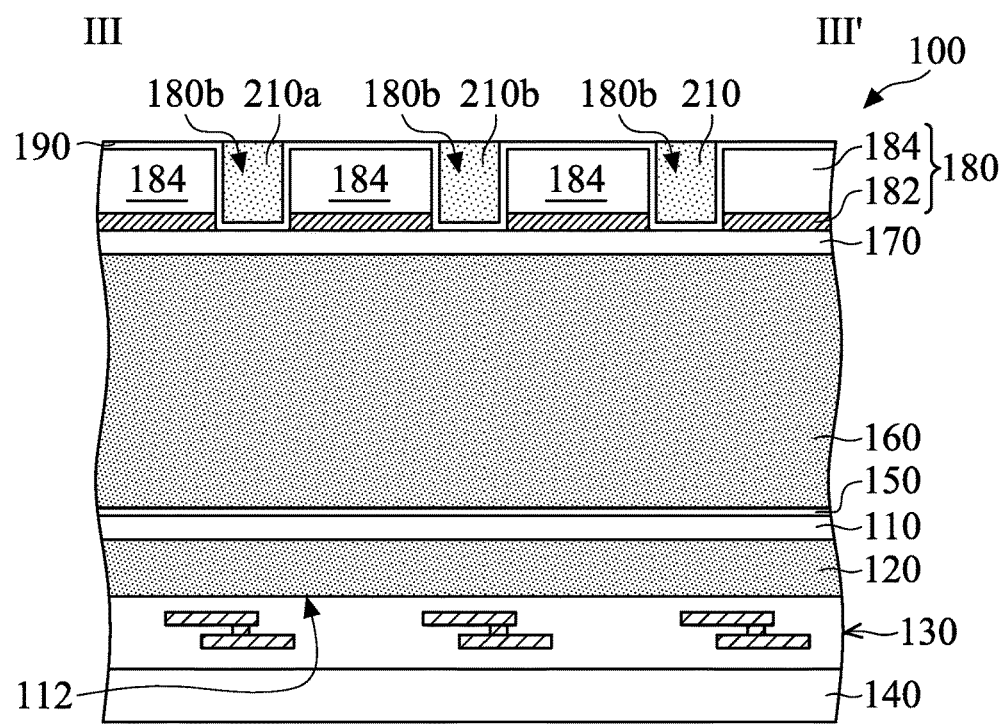

FIG. 1H-1 is a top view of the image sensor device of FIG. 1H, in accordance with some embodiments. FIG. 1H is a cross-sectional view illustrating the image sensor device along a sectional line I-I' in FIG. 1H-1, in accordance with some embodiments.

As shown in FIGS. 1H and 1H-1, a protection layer 190 is formed over the planarization layer 170 and the reflective grid 180, in accordance with some embodiments. The protection layer 190 conformally covers the planarization layer 170 and the reflective grid 180, in accordance with some embodiments.

The protection layer 190 is used to protect sidewalls 182a of the metal layer 182 from oxidation, in accordance with some embodiments. The protection layer 190 is made of oxides (e.g., silicon oxides) or another suitable protection material. The protection layer 190 is formed using a chemical vapor deposition process, in accordance with some embodiments.

As shown in FIGS. 1H and 1H-1, color filters 210, 210a, 210b, 210c, and 210d are formed in the respective openings 180a of the reflective grid 180, in accordance with some embodiments. In this step, an image sensor device 100 is substantially formed, in accordance with some embodiments.

The openings 180a are respectively filled with the color filters 210, 210a, 210b, 210c, and 210d, in accordance with some embodiments. As shown in FIGS. 1G-1, 1H, and 1H-1, the color filters 210 and 210a-210d are over the light-sensing regions 116 and 116a-116d respectively, in accordance with some embodiments.

The color filters 210 and 210a-210d are also referred to as visible light filters, in accordance with some embodiments. The color filters 210 and 210a-210d are used to filter through visible light, in accordance with some embodiments. For example, the color filters 210a, 210b, and 210d are used to filter through a red wavelength band, a green wavelength band, and a blue wavelength band, respectively. The color filter 210c is used to filter through a green wavelength band, in accordance with some embodiments.

FIG. 1H-2 is a cross-sectional view illustrating the image sensor device along a sectional line II-II' in FIG. 1H-1, in accordance with some embodiments. FIG. 1H-3 is a cross-sectional view illustrating the image sensor device along a sectional line III-III' in FIG. 1H-1, in accordance with some embodiments.

As shown in FIGS. 1H-1, 1H-2, and 1H-3, the color filters 210a and 210b both extend into the trench 180b between the color filters 210a and 210b (or between the light-sensing regions 116a and 116b) to be in direct contact with each other, in accordance with some embodiments. Similarly, the color filters 210a and 210c both extend into the trench 180b between the color filters 210a and 210c (or between the light-sensing regions 116a and 116c) to be in direct contact with each other, in accordance with some embodiments.

The color filters 210c and 210d both extend into the trench 180b between the color filters 210c and 210d (or between the light-sensing regions 116c and 116d) to be in direct contact with each other, in accordance with some embodiments. Therefore, two adjacent color filters (e.g., 210 and 210a-210d) are in direct contact with (or directly connected to) each other through the trench 180b therebetween, in accordance with some embodiments. Each of the color filters (e.g., 210 and 210a-210d) is in direct contact with the adjacent color filters (e.g., 210 and 210a-210d), in accordance with some embodiments.

As shown in the FIG. 1H-1, the trench 180b has a width W2 (or a maximum width W2), and the color filter 210, 210a, 210b, 210c, or 210d has a width W3 (or a maximum width W3). In some embodiments, a ratio (W2/W3) of the width W2 to the width W3 is greater than zero and less than or equal to 0.5. If the ratio (W2/W3) is less than or equal to 0.5, optical crosstalk is reduced, and quantum efficiency is improved.

The color filters 210 and 210a-210d are made of a material that is different from that of the reflective grid 180, in accordance with some embodiments. The color filters 210 and 210a-210d are made of a polymer material, such as a photoresist material, in accordance with some embodiments. The color filters 210 and 210a-210d are formed using coating processes and photolithography processes, in accordance with some embodiments.

Since the color filters 210 and 210a-210d have the same material which is different from that of the reflective grid 180, the color filters 210 and 210a-210d have a thermal expansion coefficient that is different from that of the reflective grid 180, in accordance with some embodiments.

Two adjacent color filters (e.g., 210 and 210a-210d) are in direct contact with (or directly connected to) each other, and therefore the thermal expansion stress may be released through the homojunction between the color filters 210 and 210a-210d rather than the heterojunction between the color filters 210 and 210a-210d and the reflective grid 180 (or the protection layer 190), in accordance with some embodiments. As a result, delamination between the color filters 210 and 210a-210d and the reflective grid 180 is prevented or reduced during subsequent thermal processes, in accordance with some embodiments. Therefore, the yield of the color filters 210 and 210a-210d is improved.

Figure 1I:
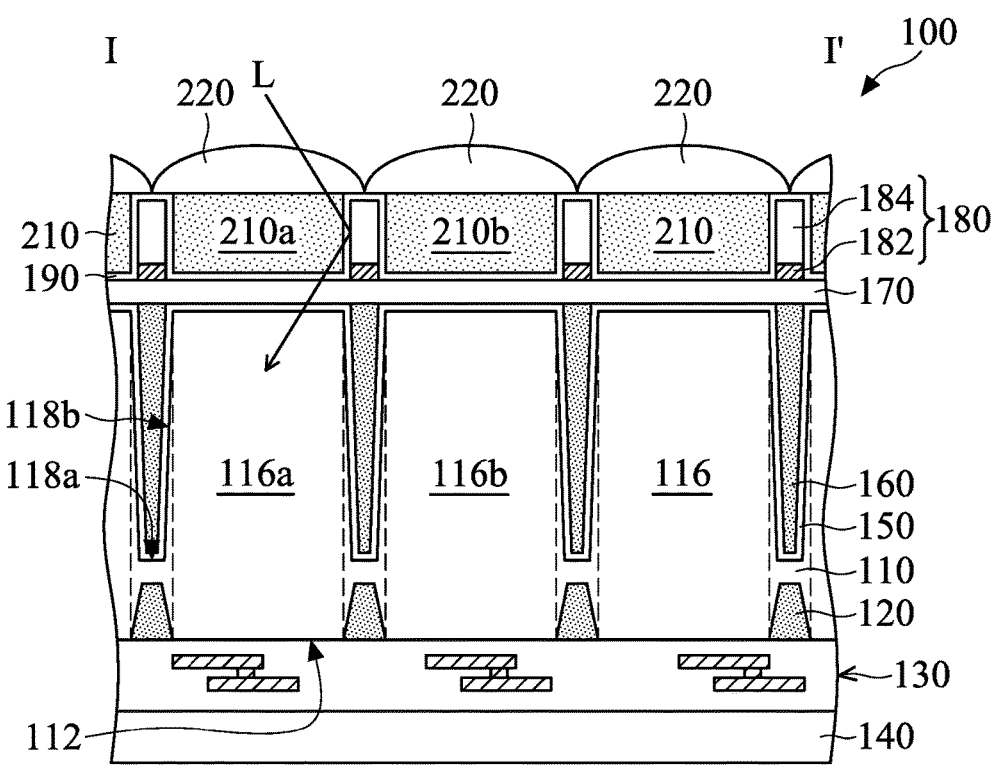
Figures 1, 1I:
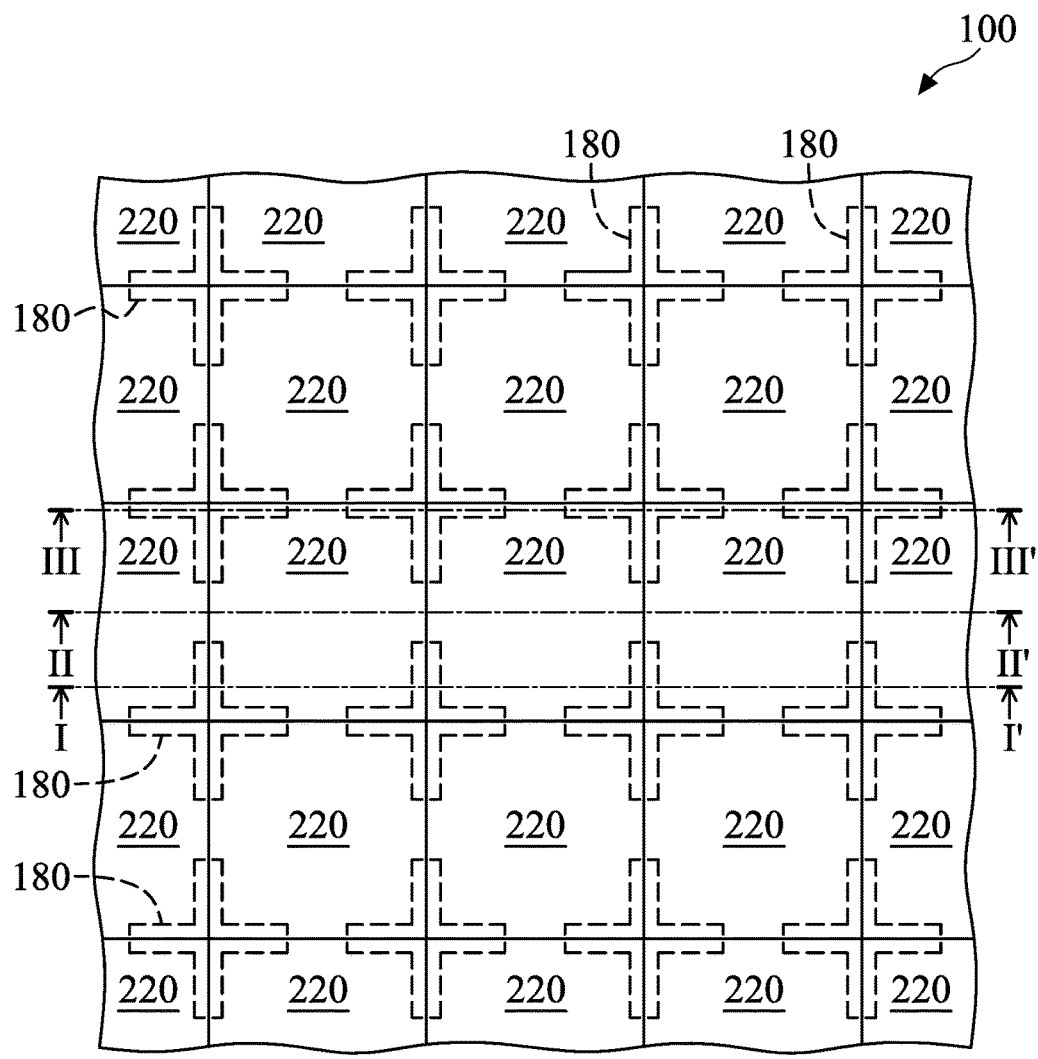
Figures 1, 1I, 2:
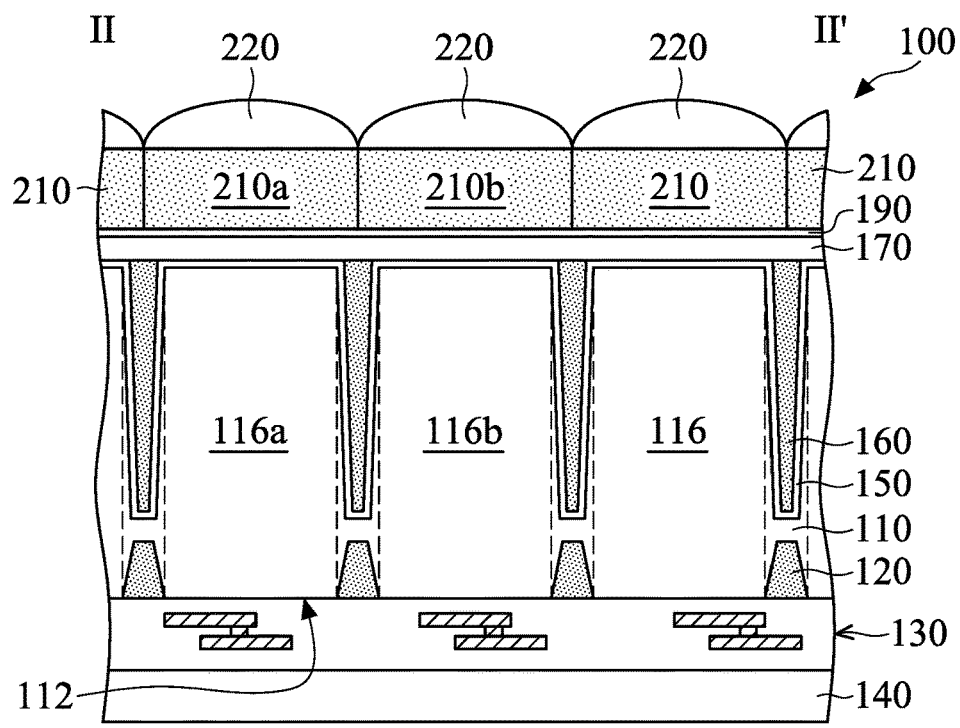
Figures 1, 1I, 2, 3:
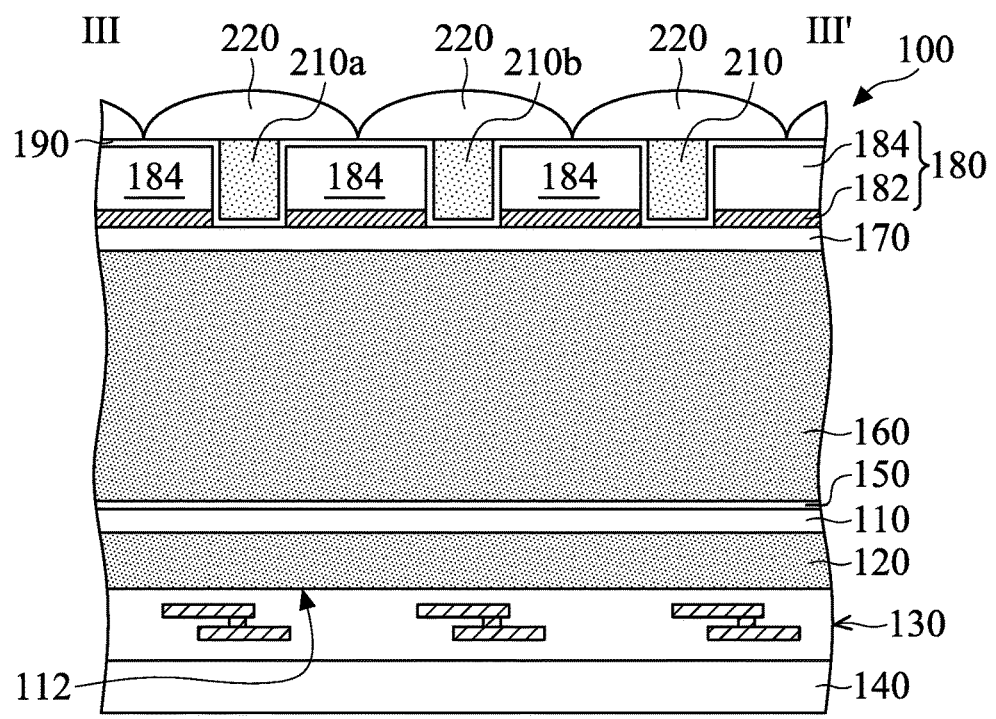

FIG. 1I-1 is a top view of the image sensor device of FIG. 1I, in accordance with some embodiments. FIG. 1I is a cross-sectional view illustrating the image sensor device along a sectional line I-I' in FIG. 1I-1, in accordance with some embodiments. FIG. 1I-2 is a cross-sectional view illustrating the image sensor device along a sectional line II-II' in FIG. 1I-1, in accordance with some embodiments. FIG. 1I-3 is a cross-sectional view illustrating the image sensor device along a sectional line III-III' in FIG. 1I-1, in accordance with some embodiments.

Afterwards, as shown in FIGS. 1H-1, 1I and 1I-1, lenses 220 are respectively formed over the color filters 210 and 210a-210d, in accordance with some embodiments. The lenses 220 are used to direct or focus the incident light. As shown in FIGS. 1I-1, 1I-2 and 1I-3, the lenses 220 may include a microlens array. The lenses 220 may be made of a high transmittance material. For example, the high transmittance material includes transparent polymer material (such as polymethylmethacrylate, PMMA), transparent ceramic material (such as glass), other applicable materials, or a combination thereof.

As shown in FIG. 1I, incident light L traveling into the color filter 210a and arriving at the reflective grid 180 may be reflected by the reflective grid 180 and thus travel back into the color filter 210a and travel into the light-sensing region 116a under the color filter 210a. Therefore, the reflective grid 180 may reduce optical crosstalk and improve quantum efficiency.

Furthermore, since the thermal expansion stress is released through the homojunction between the color filters 210 and 210a-210d (as shown in FIG. 1H-1), the delamination between the color filters 210 and 210a-210d and the reflective grid 180 (or the protection layer 190) is prevented or reduced during subsequent thermal processes, and the yield of the image sensor device 100 is improved.

Figure 2A:
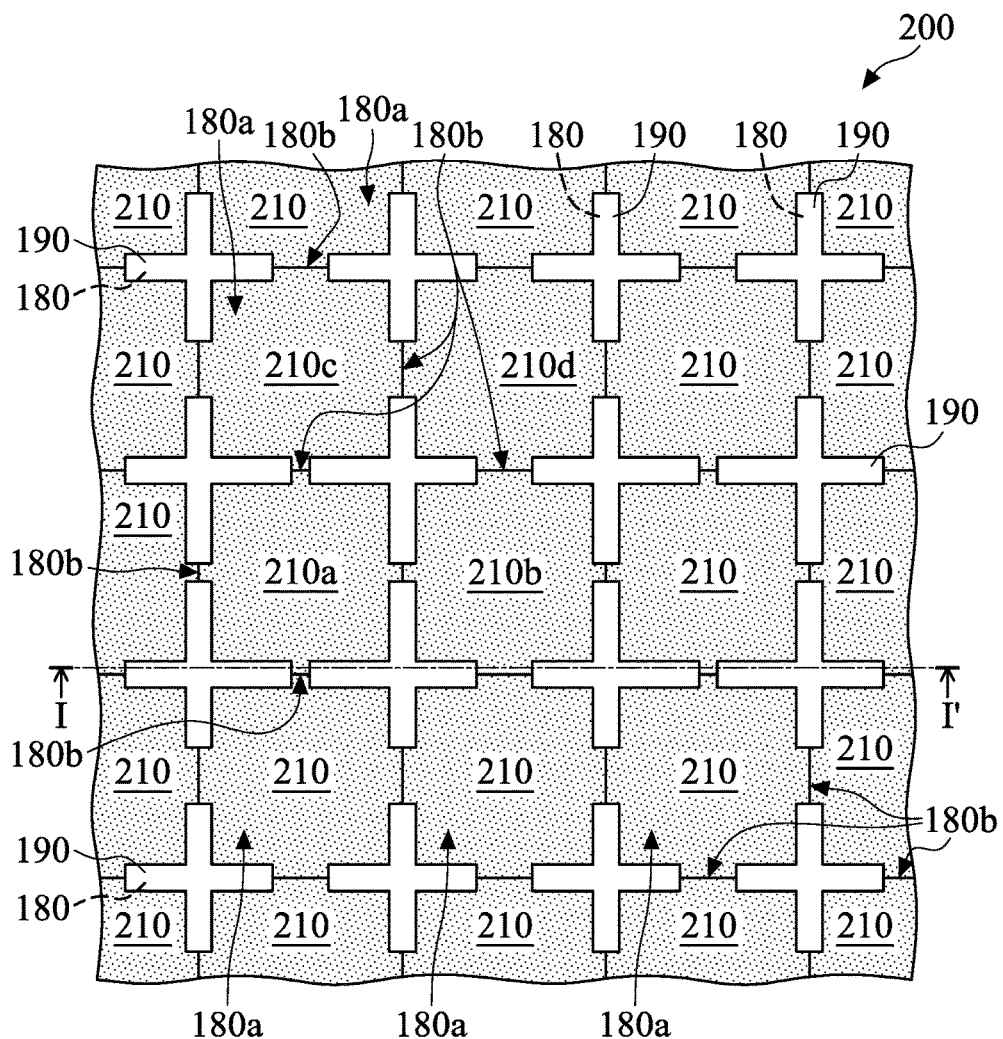
FIG. 2A is a top view of an image sensor device, in accordance with some embodiments.
Figure 2B:
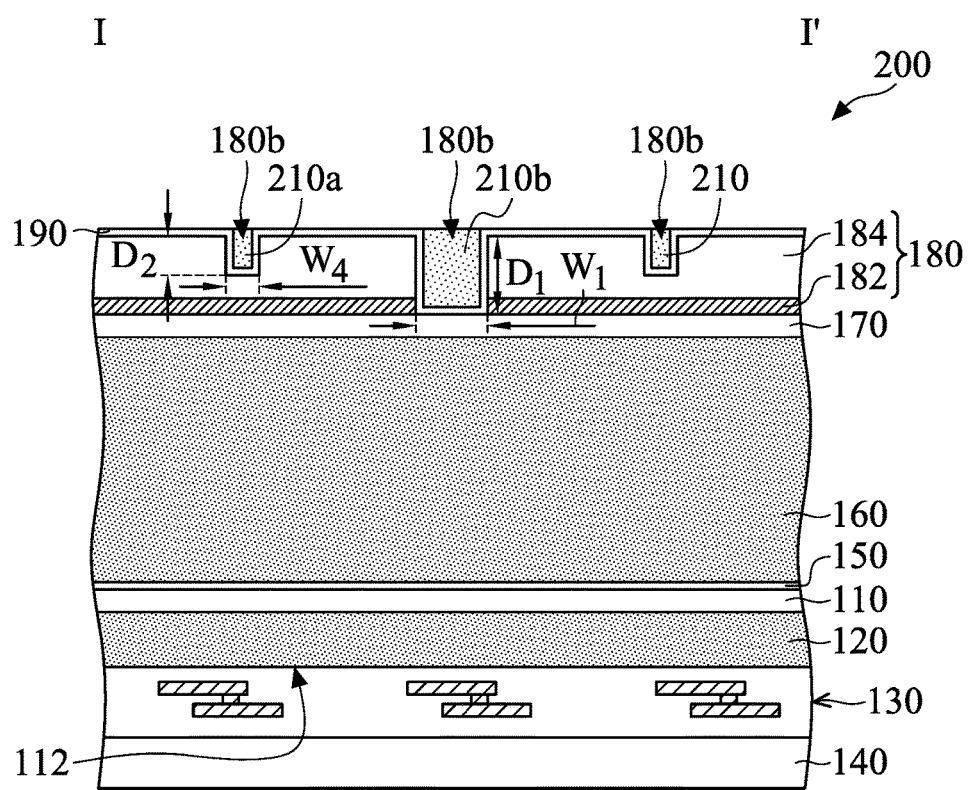
FIG. 2B is a cross-sectional view illustrating the image sensor device along a sectional line I-I' in FIG. 2A, in accordance with some embodiments.

FIG. 2A is a top view of an image sensor device, in accordance with some embodiments. FIG. 2B is a cross-sectional view illustrating the image sensor device along a sectional line I-I' in FIG. 2A, in accordance with some embodiments.

As shown in FIGS. 2A and 2B, an image sensor device 200 is similar to the image sensor device 100 of FIG. 1H-1, except that the trenches 180b of the reflective grid 180 of the image sensor device 200 have the different widths W1 and W4 and different depths D1 and D2, in accordance with some embodiments. Each of the trenches 180b surrounding the color filter 210a has the width W4 and the depth D2, in accordance with some embodiments.

The width W4 is less than the width W1, in accordance with some embodiments. The depth D2 is less than the depth D1, in accordance with some embodiments. Therefore, the reflective grid 180 of the image sensor device 200 may prevent incident light traveling into the color filter 210a from further traveling into the color filters 210, 210b, and 210c adjacent to the color filter 210a, in accordance with some embodiments. Therefore, the reflective grid 180 may reduce optical crosstalk and improve quantum efficiency of the pixel with the color filter 210a.

The color filter 210a is used to transmit a first light having a first wavelength, in accordance with some embodiments. The color filter 210b (or the color filter 210c, 210d or 210) is used to filter through a second light having a second wavelength, in accordance with some embodiments. The first wavelength is greater the second wavelength, in accordance with some embodiments. The first light is, for example, a red visible light, and the second light is, for example, a blue visible light or a green visible light.

Figure 3A:
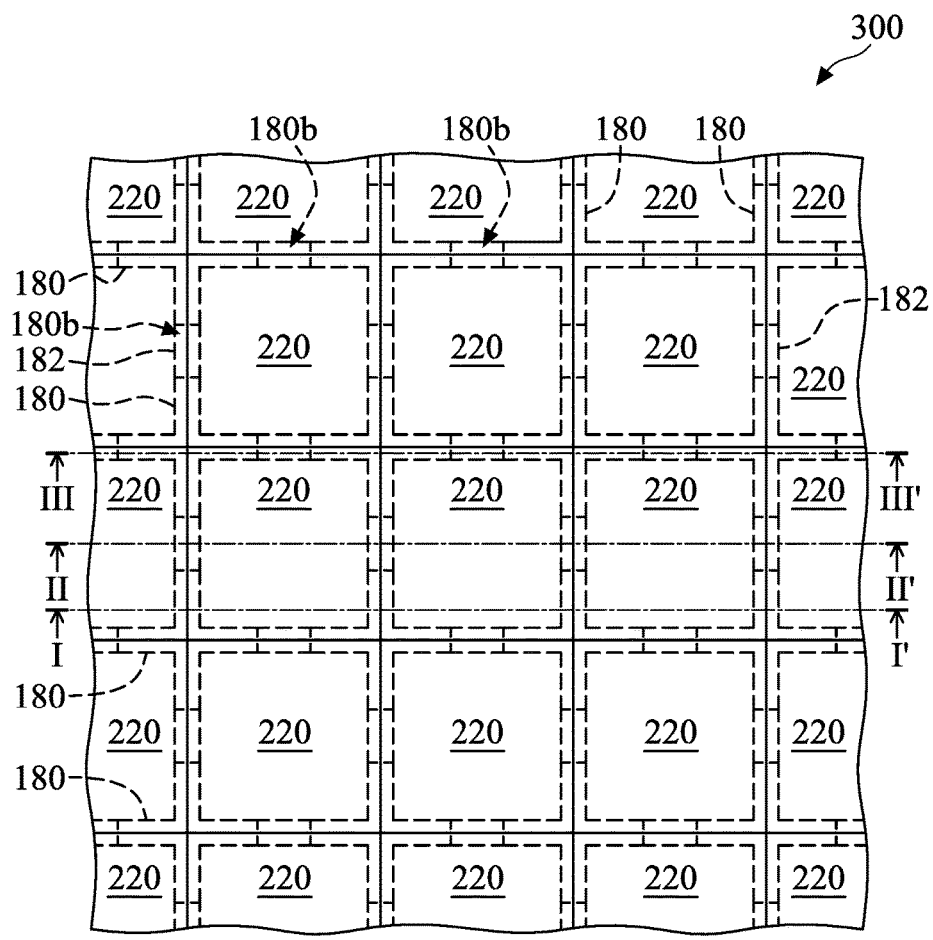
FIG. 3A is a top view of an image sensor device, in accordance with some embodiments.
Figure 3B:
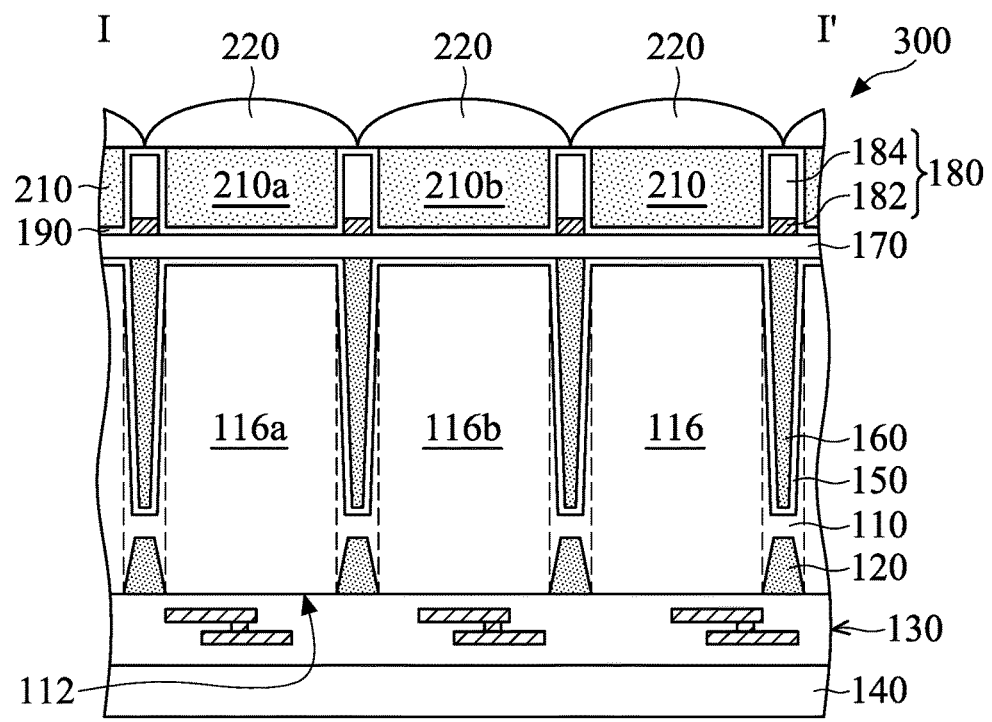
FIG. 3B is a cross-sectional view illustrating the image sensor device along a sectional line I-I' in FIG. 3A, in accordance with some embodiments.
Figure 3C:
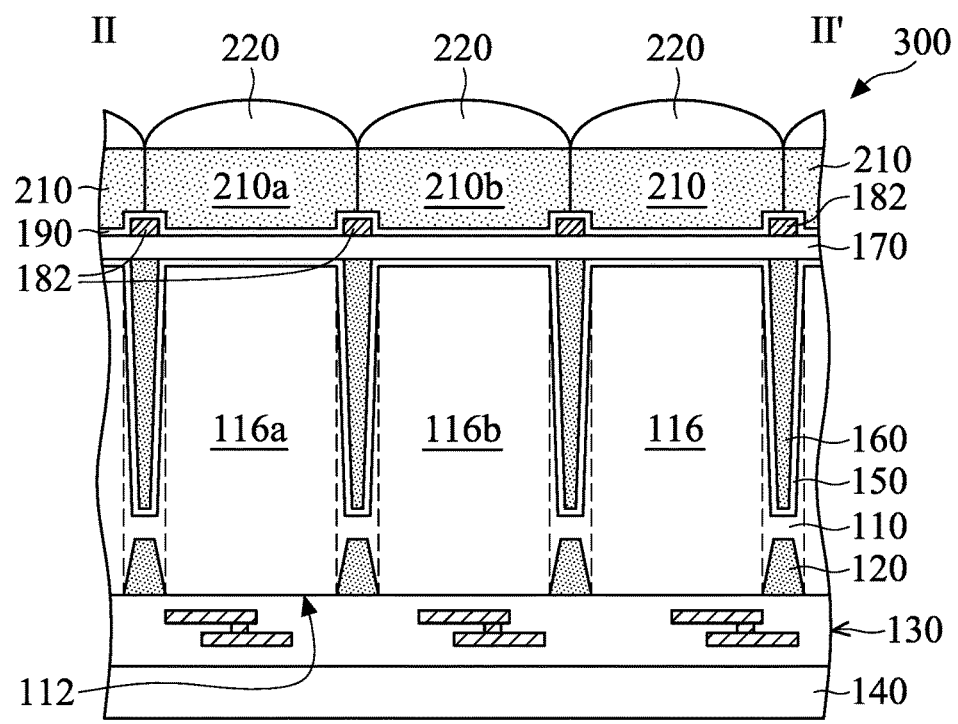
FIG. 3C is a cross-sectional view illustrating the image sensor device along a sectional line II-II' in FIG. 3A, in accordance with some embodiments.
Figure 3D:
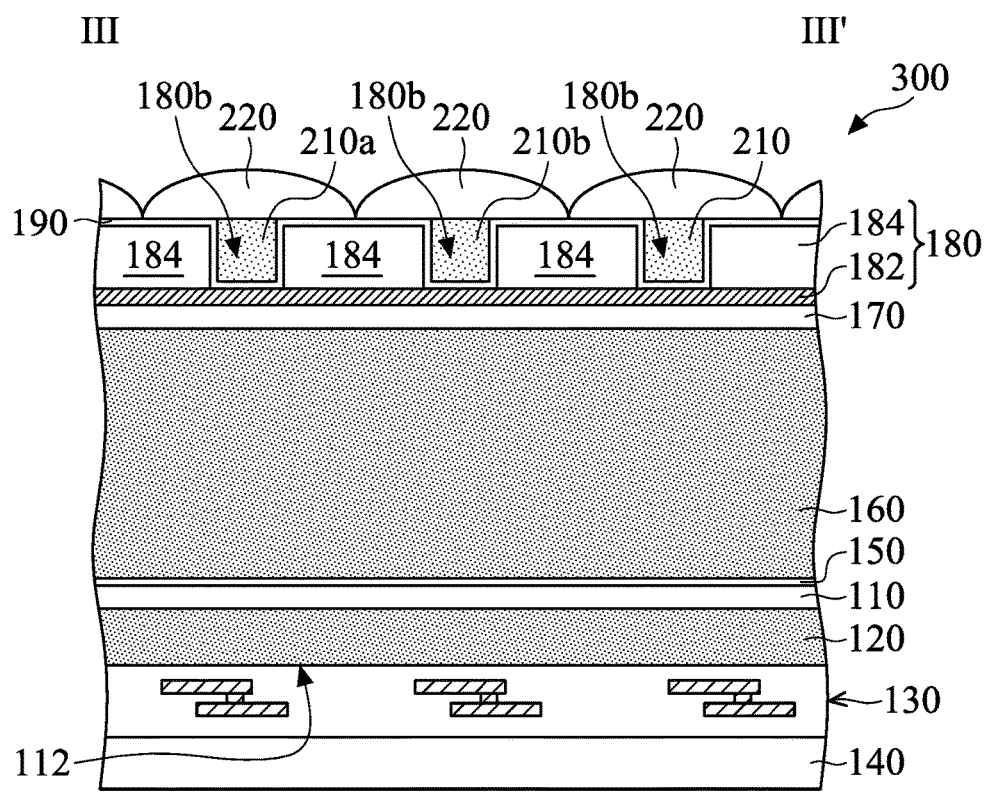
FIG. 3D is a cross-sectional view illustrating the image sensor device along a sectional line III-III' in FIG. 3A, in accordance with some embodiments.

FIG. 3A is a top view of an image sensor device 300, in accordance with some embodiments. FIG. 3B is a cross-sectional view illustrating the image sensor device along a sectional line I-I' in FIG. 3A, in accordance with some embodiments. FIG. 3C is a cross-sectional view illustrating the image sensor device along a sectional line II-II' in FIG. 3A, in accordance with some embodiments. FIG. 3D is a cross-sectional view illustrating the image sensor device along a sectional line III-III' in FIG. 3A, in accordance with some embodiments.

As shown in FIGS. 3A-3D, an image sensor device 300 is similar to the image sensor device 100 of FIG. 1I-1, except that the trenches 180b of the reflective grid 180 of the image sensor device 300 do not pass through (or do not extend into) the metal layer 182, in accordance with some embodiments. That is, the trenches 180b only pass through the insulating layer 184, in accordance with some embodiments.

In some embodiments, as shown in FIGS. 3A and 3D, portions of the metal layer 182 are under the trenches 180b. As shown in FIGS. 3C and 3D, the color filters 210 and 210a-210d in the trenches 180b are over the portions of the metal layer 182, in accordance with some embodiments. The metal layer 182 is a continuous mesh structure, in accordance with some embodiments.

Figure 4A:
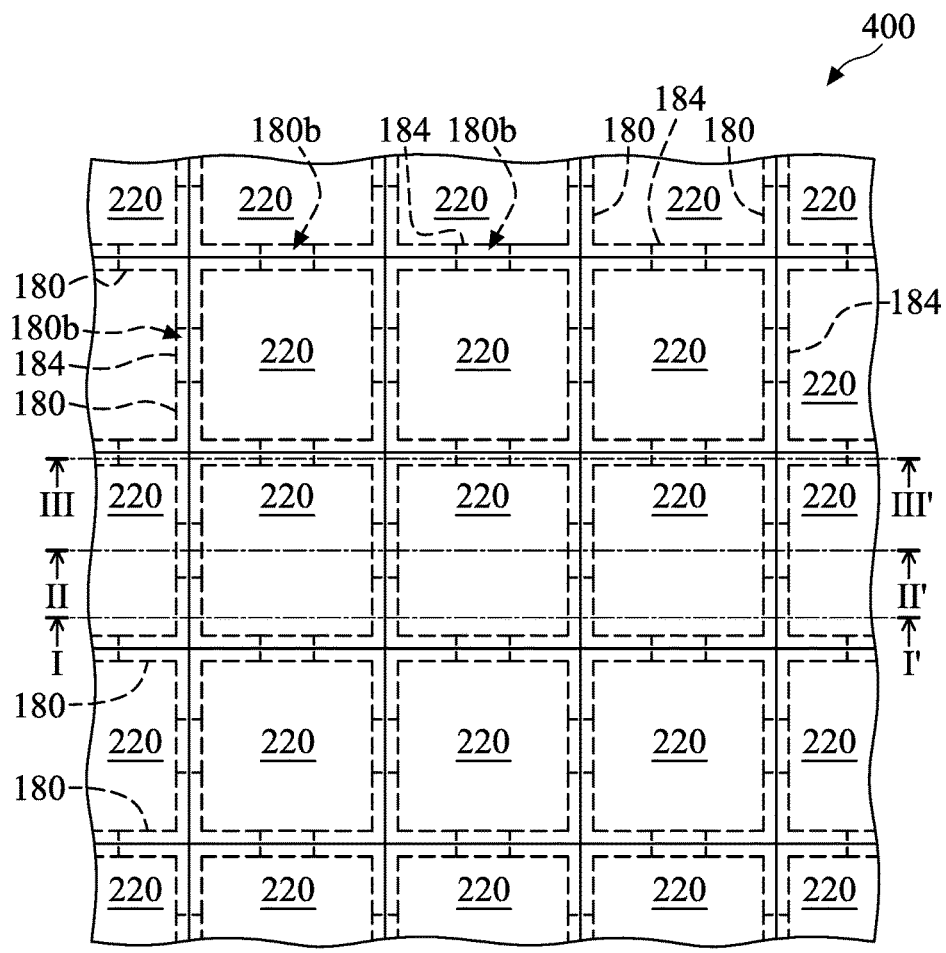
FIG. 4A is a top view of an image sensor device, in accordance with some embodiments.
Figure 4B:
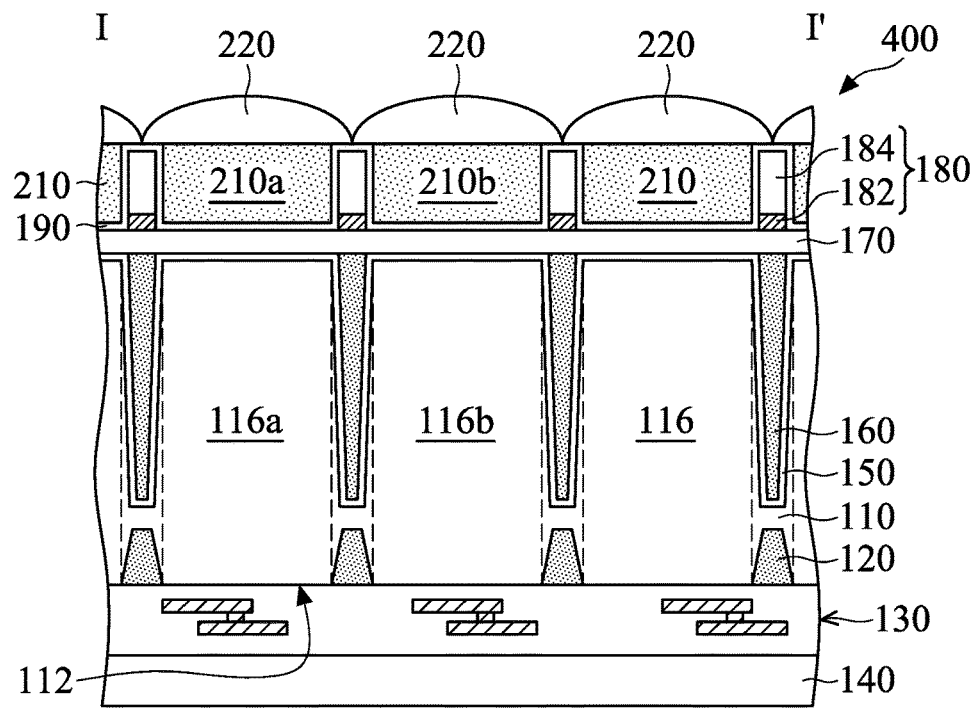
FIG. 4B is a cross-sectional view illustrating the image sensor device along a sectional line I-I' in FIG. 4A, in accordance with some embodiments.
Figure 4C:
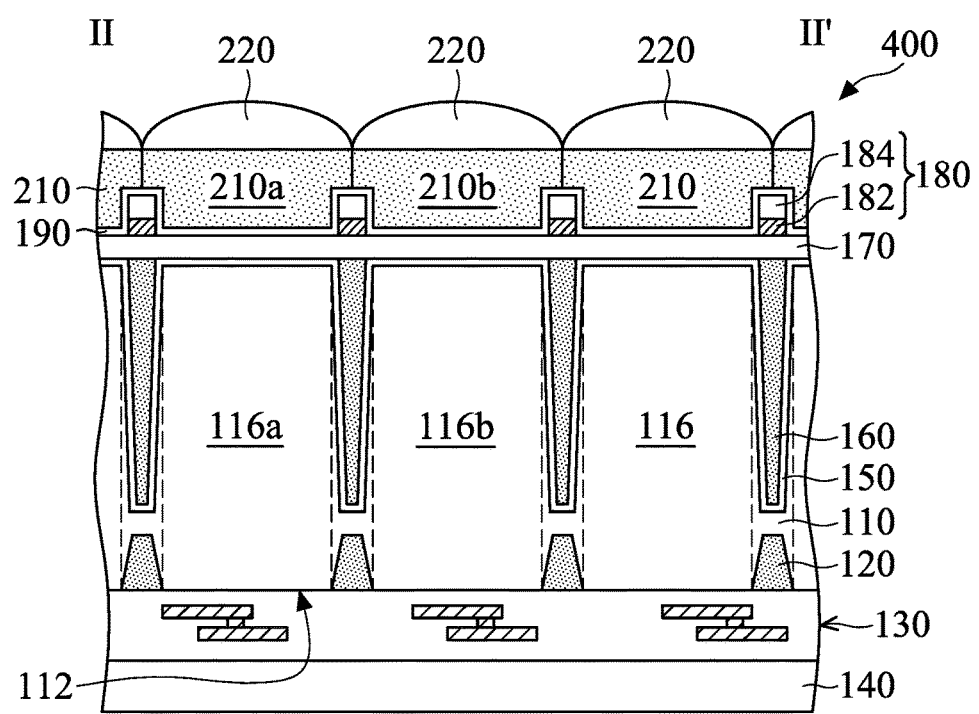
FIG. 4C is a cross-sectional view illustrating the image sensor device along a sectional line II-II' in FIG. 4A, in accordance with some embodiments.
Figure 4D:
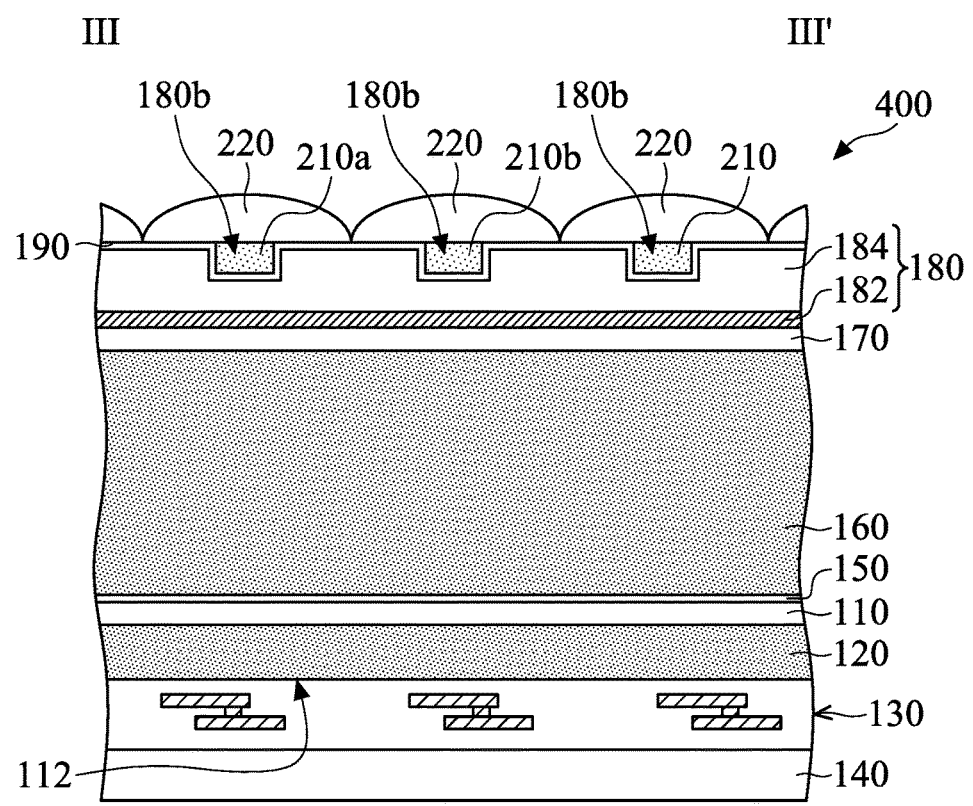
FIG. 4D is a cross-sectional view illustrating the image sensor device along a sectional line III-III' in FIG. 4A, in accordance with some embodiments.

FIG. 4A is a top view of an image sensor device 400, in accordance with some embodiments. FIG. 4B is a cross-sectional view illustrating the image sensor device along a sectional line I-I' in FIG. 4A, in accordance with some embodiments. FIG. 4C is a cross-sectional view illustrating the image sensor device along a sectional line II-II' in FIG. 4A, in accordance with some embodiments. FIG. 4D is a cross-sectional view illustrating the image sensor device along a sectional line III-III' in FIG. 4A, in accordance with some embodiments.

As shown in FIGS. 4A-4D, an image sensor device 400 is similar to the image sensor device 100 of FIG. 1I-1, except that the trenches 180b of the reflective grid 180 of the image sensor device 400 do not pass through the metal layer 182 and the insulating layer 184, in accordance with some embodiments. The trenches 180b only extend into a top portion of the insulating layer 184, in accordance with some embodiments.

In some embodiments, portions of the insulating layer 184 are under the trenches 180b. The insulating layer 184 is a continuous mesh structure, in accordance with some embodiments. The metal layer 182 is a continuous mesh structure, in accordance with some embodiments. That is, the reflective grid 180 is a continuous mesh structure, in accordance with some embodiments.

Figure 5A:
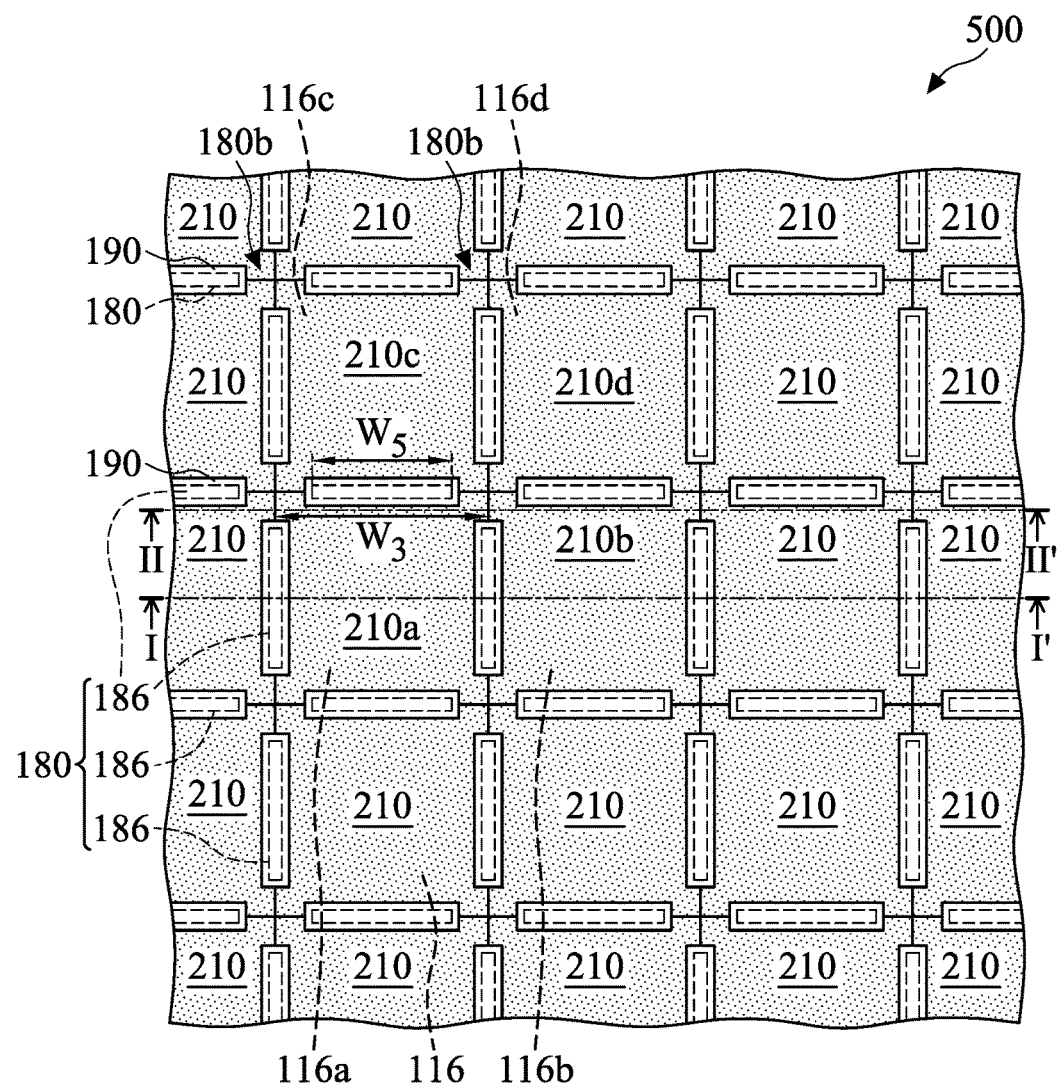
FIGS. 5A-5B are top views of various stages of a process for forming an image sensor device, in accordance with some embodiments.
Figures 1, 5A:
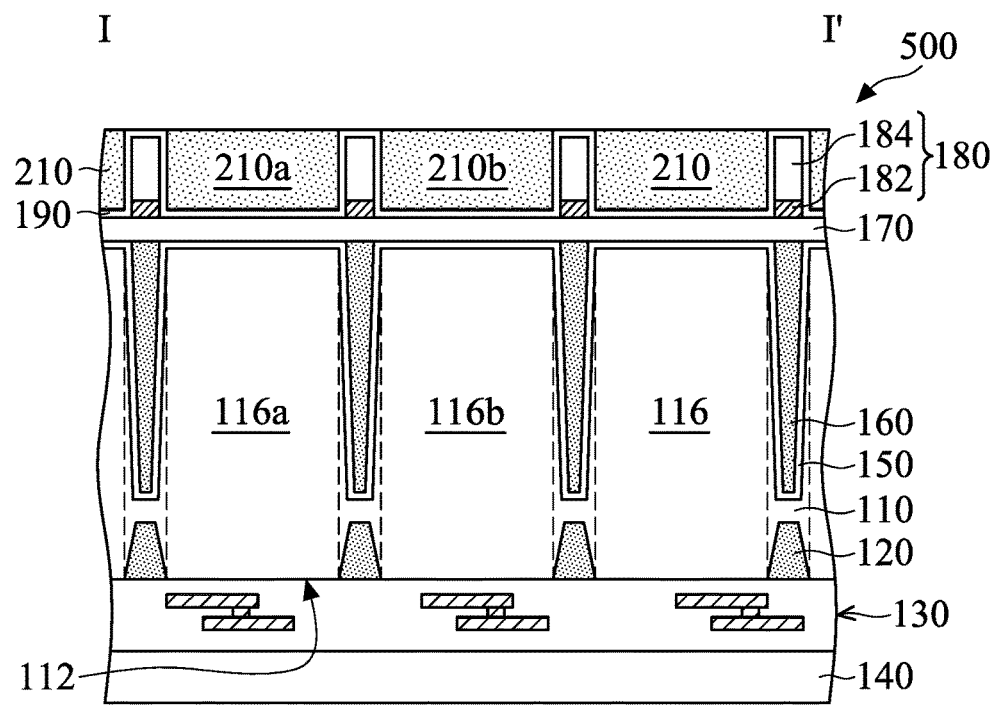
Figures 2, 5A:
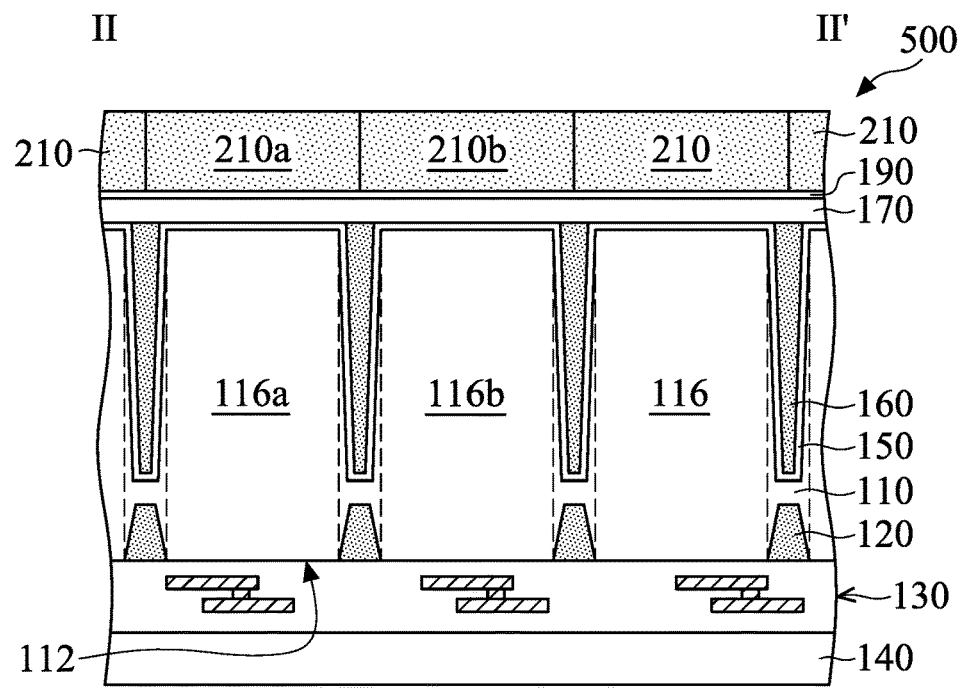
Figure 5B:
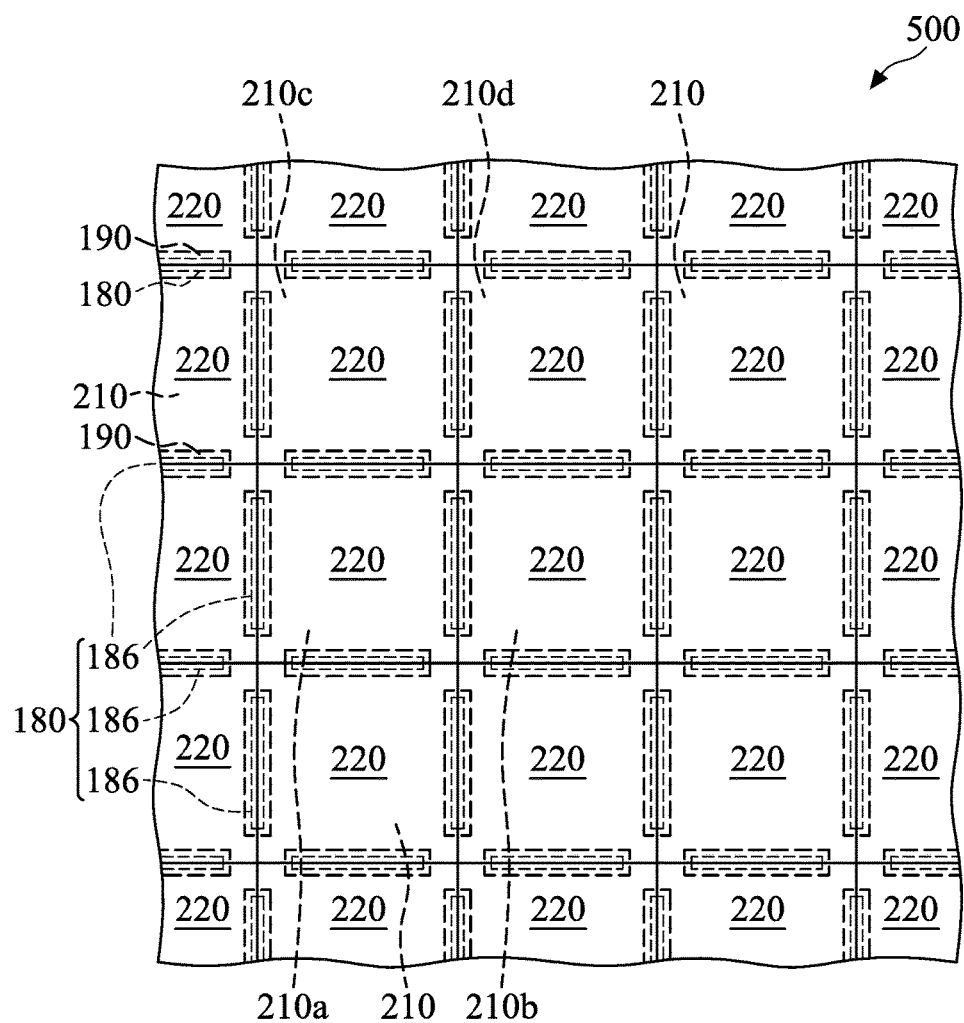

FIGS. 5A-5B are top views of various stages of a process for forming an image sensor device, in accordance with some embodiments. FIG. 5A-1 is a cross-sectional view illustrating the image sensor device along a sectional line I-I' in FIG. 5A, in accordance with some embodiments. FIG. 5A-2 is a cross-sectional view illustrating the image sensor device along a sectional line II-II' in FIG. 5A, in accordance with some embodiments.

As shown in FIGS. 5A, 5A-1, and 5A-2, an image sensor device 500 is similar to the image sensor device 100 of FIG. 1H-1, except that the trenches 180b of the reflective grid 180 of the image sensor device 500 is between four adjacent color filters (e.g., the color filters 210 and/or 210a-210d) or between four adjacent light-sensing regions (e.g. the light-sensing regions 116 and/or 116a-116d), in accordance with some embodiments. The four adjacent color filters (e.g., the color filters 210 and/or 210a-210d) together extend into one of the trenches 180b to be in direct contact with each other, in accordance with some embodiments.

As shown in FIG. 5A, the reflective grid 180 is divided into line-shaped portions 186 spaced apart from each other by the trenches 180b, in accordance with some embodiments. The line-shaped portions 186 has a width W5 (or a maximum width W5), in accordance with some embodiments. The color filter 210, 210a, 210b, 210c, or 210d has a width W3 (or a maximum width W3), in accordance with some embodiments.

In some embodiments, a ratio (W5/W3) of the width W5 to the width W3 is greater than or equal to 0.5 and less than 1. If the ratio (W5/W3) is greater than or equal to 0.5, optical crosstalk is reduced, and quantum efficiency is improved. As shown in FIGS. 5A and 5B, a step of FIG. 1I is performed to form lenses 220 over the color filters 210 and 210a-210d respectively, in accordance with some embodiments.

In accordance with some embodiments, an image sensor device is provided. The image sensor device has a reflective grid between color filters, and the adjacent color filters are in direct contact with each other. Therefore, the thermal expansion stress is released through the homojunction between the color filters, and the delamination between the color filters and the reflective grid is prevented or reduced. As a result, the yield of the image sensor device is improved.

In accordance with some embodiments, an image sensor device is provided. The image sensor device includes a semiconductor substrate having a first light-sensing region and a second light-sensing region adjacent to the first light-sensing region. The image sensor device includes an isolation structure in the semiconductor substrate and surrounding the first light-sensing region and the second light-sensing region. The isolation structure separates the first light-sensing region from the second light-sensing region. The image sensor device includes a reflective grid over the isolation structure and surrounding the first light-sensing region and the second light-sensing region. A first portion of the reflective grid is between the first light-sensing region and the second light-sensing region and has a first trench. The image sensor device includes a first color filter over the first light-sensing region and extending into the first trench. The image sensor device includes a second color filter over the second light-sensing region and extending into the first trench to be in direct contact with the first color filter in the first trench.

In accordance with some embodiments, an image sensor device is provided. The image sensor device includes a semiconductor substrate having a first light-sensing region and a second light-sensing region adjacent to the first light-sensing region. The image sensor device includes an isolation structure in the semiconductor substrate and surrounding the first light-sensing region and the second light-sensing region. A first portion of the isolation structure is between the first light-sensing region and the second light-sensing region. The image sensor device includes a reflective grid over the isolation structure and surrounding the first light-sensing region and the second light-sensing region. A second portion of the reflective grid is over the first portion. The image sensor device includes a first color filter over the first light-sensing region and extending into the second portion. The image sensor device includes a second color filter over the second light-sensing region and extending into the second portion to be in direct contact with the first color filter in the first portion.

In accordance with some embodiments, an image sensor device is provided. The image sensor device includes a semiconductor substrate having a first light-sensing region and a second light-sensing region. The image sensor device includes an isolation structure in the semiconductor substrate and surrounding the first light-sensing region and the second light-sensing region. The image sensor device includes a reflective grid over the isolation structure and discontinuously surrounding the first light-sensing region and the second light-sensing region. A first portion of the reflective grid has a trench. The image sensor device includes a first color filter over the first light-sensing region and extending into the trench. The image sensor device includes a second color filter over the second light-sensing region and extending into the trench to be in direct contact with the first color filter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a semiconductor substrate having a first light-sensing region and a second light-sensing region adjacent to the first light-sensing region;
   an isolation structure in the semiconductor substrate and surrounding the first light-sensing region and the second light-sensing region, wherein the isolation structure separates the first light-sensing region from the second light-sensing region;
   a reflective grid over the isolation structure and surrounding the first light-sensing region and the second light-sensing region, wherein a first portion of the reflective grid is between the first light-sensing region and the second light-sensing region and has a first trench;
   a first color filter over the first light-sensing region and extending into the first trench; and
   a second color filter over the second light-sensing region and extending into the first trench to be in direct contact with the first color filter in the first trench.

2. The image sensor device as claimed in claim 1, wherein the first trench passes through the reflective grid.

3. The image sensor device as claimed in claim 1, wherein a bottom portion of the reflective grid is under the first trench.

4. The image sensor device as claimed in claim 1, wherein a ratio of a first width of the first trench to a second width of the first color filter is greater than zero and less than or equal to 0.5.

5. The image sensor device as claimed in claim 1, wherein the first portion of the reflective grid further has a second trench spaced apart from the first trench, and the second color filter is in direct contact with the first color filter through the second trench.

6. The image sensor device as claimed in claim 5, wherein the semiconductor substrate further has a third light-sensing region and a fourth light-sensing region, the third light-sensing region is adjacent to the first light-sensing region, the fourth light-sensing region is adjacent to the second light-sensing region and the third light-sensing region, the reflective grid further surrounds the third light-sensing region and the fourth light-sensing region, a second portion of the reflective grid is between the third light-sensing region and the fourth light-sensing region, the second trench extends into the second portion, and
   the image sensor device further comprises:
   a third color filter over the third light-sensing region and extending into the second trench to be in direct contact with the first color filter; and
   a fourth color filter over the fourth light-sensing region and extending into the second trench to be in direct contact with the second color filter and the third color filter.

7. The image sensor device as claimed in claim 1, wherein the semiconductor substrate further has a third light-sensing region and a fourth light-sensing region, the reflective grid further surrounds the third light-sensing region and the fourth light-sensing region, a second portion of the reflective grid is between the third light-sensing region and the fourth light-sensing region and has a second trench, and a first width of the first trench is less than a second width of the second trench.

8. The image sensor device as claimed in claim 1, wherein the semiconductor substrate further has a third light-sensing region and a fourth light-sensing region, the reflective grid further surrounds the third light-sensing region and the fourth light-sensing region, a second portion of the reflective grid is between the third light-sensing region and the fourth light-sensing region and has a second trench, and a first depth of the first trench is less than a second depth of the second trench.

9. The image sensor device as claimed in claim 1, wherein the reflective grid comprises a metal layer and an insulating layer over the metal layer, and the first trench is formed in the insulating layer.

10. The image sensor device as claimed in claim 9, wherein the first trench extends into the metal layer to pass through the insulating layer and the metal layer.

11. An image sensor device, comprising:
a semiconductor substrate having a first light-sensing region and a second light-sensing region adjacent to the first light-sensing region;
an isolation structure in the semiconductor substrate and surrounding the first light-sensing region and the second light-sensing region, wherein a first portion of the isolation structure is between the first light-sensing region and the second light-sensing region;
a reflective grid over the isolation structure and surrounding the first light-sensing region and the second light-sensing region, wherein a second portion of the reflective grid is over the first portion;
a first color filter over the first light-sensing region and extending into the second portion; and
a second color filter over the second light-sensing region and extending into the second portion to be in direct contact with the first color filter in the second portion.

12. The image sensor device as claimed in claim 11, wherein the reflective grid comprises a metal layer and an insulating layer over the metal layer, and the first color filter and the second color filter extend into the insulating layer.

13. The image sensor device as claimed in claim 12, wherein the first color filter and the second color filter extend into the metal layer.

14. The image sensor device as claimed in claim 11, wherein the reflective grid has a plurality of cross-shaped portions spaced apart from each other.

15. The image sensor device as claimed in claim 11, wherein the reflective grid has a plurality of line-shaped portions spaced apart from each other.

16. The image sensor device as claimed in claim 11, wherein the reflective grid has a mesh shape.

17. An image sensor device, comprising:
a semiconductor substrate having a first light-sensing region and a second light-sensing region;
an isolation structure in the semiconductor substrate and surrounding the first light-sensing region and the second light-sensing region;
a reflective grid over the isolation structure and discontinuously surrounding the first light-sensing region and the second light-sensing region, wherein a first portion of the reflective grid has a trench;
a first color filter over the first light-sensing region and extending into the trench; and
a second color filter over the second light-sensing region and extending into the trench to be in direct contact with the first color filter.

18. The image sensor device as claimed in claim 17, wherein the reflective grid has a first opening and a second opening, the first opening is over the first light-sensing region, the second opening is over the second light-sensing region, and the first opening is communicated with the second opening via the trench.

19. The image sensor device as claimed in claim 18, wherein the first opening is filled with the first color filter, and the second opening is filled with the second color filter.

20. The image sensor device as claimed in claim 17, wherein the reflective grid comprises a metal layer and an insulating layer over the metal layer, and a first thickness of the insulating layer is greater than a second thickness of the metal layer.

* * * * *